(12) United States Patent
Fujimoto

(10) Patent No.: US 8,409,955 B2
(45) Date of Patent: Apr. 2, 2013

(54) METHOD OF FORMING A SEMICONDUCTOR DEVICE

(75) Inventor: Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/964,777

(22) Filed: Dec. 10, 2010

(65) Prior Publication Data

US 2011/0143509 A1 Jun. 16, 2011

(30) Foreign Application Priority Data

Dec. 15, 2009 (JP) ................................. 2009-283948

(51) Int. Cl.
*H01L 21/336* (2006.01)
(52) U.S. Cl. .......... 438/270; 257/E21.396; 257/E29.201
(58) Field of Classification Search .................. 438/270, 438/586; 257/E29.201, E21.396, E21.158, 257/E21.409
See application file for complete search history.

(56) References Cited

U.S. PATENT DOCUMENTS

| | | | | |
|---|---|---|---|---|
| 2004/0262674 | A1* | 12/2004 | Shimizu ........................ | 257/324 |
| 2007/0275509 | A1* | 11/2007 | Yoo et al. ...................... | 438/129 |
| 2010/0200948 | A1* | 8/2010 | Kim .............................. | 257/520 |
| 2010/0240180 | A1* | 9/2010 | Jeon et al. ..................... | 438/239 |
| 2010/0330775 | A1* | 12/2010 | Shin et al. ..................... | 438/430 |
| 2011/0001186 | A1* | 1/2011 | Seo et al. ...................... | 257/330 |

FOREIGN PATENT DOCUMENTS

| | | |
|---|---|---|
| JP | 2006-339476 | 12/2006 |
| JP | 2007-081095 | 3/2007 |

* cited by examiner

*Primary Examiner* — William D Coleman
*Assistant Examiner* — Christine Enad
(74) *Attorney, Agent, or Firm* — Young & Thompson

(57) ABSTRACT

A method of forming a semiconductor device includes the following processes. A groove is formed in a semiconductor substrate. A gate insulating film is formed on an inside wall of the groove. A buried gate electrode is formed on the gate insulating film and on a bottom portion of the groove. A cap insulating film covering the buried gate electrode is formed in an upper portion of the groove. The cap insulating film has a top surface which is different in level from a top surface of the semiconductor substrate. A first inter-layer insulating film is formed on the top surface of the semiconductor substrate and on the top surface of the cap insulating film. The first inter-layer insulating film with a flat top surface fills a gap in level between the top surface of the semiconductor substrate and the top surface of the cap insulating film.

14 Claims, 29 Drawing Sheets

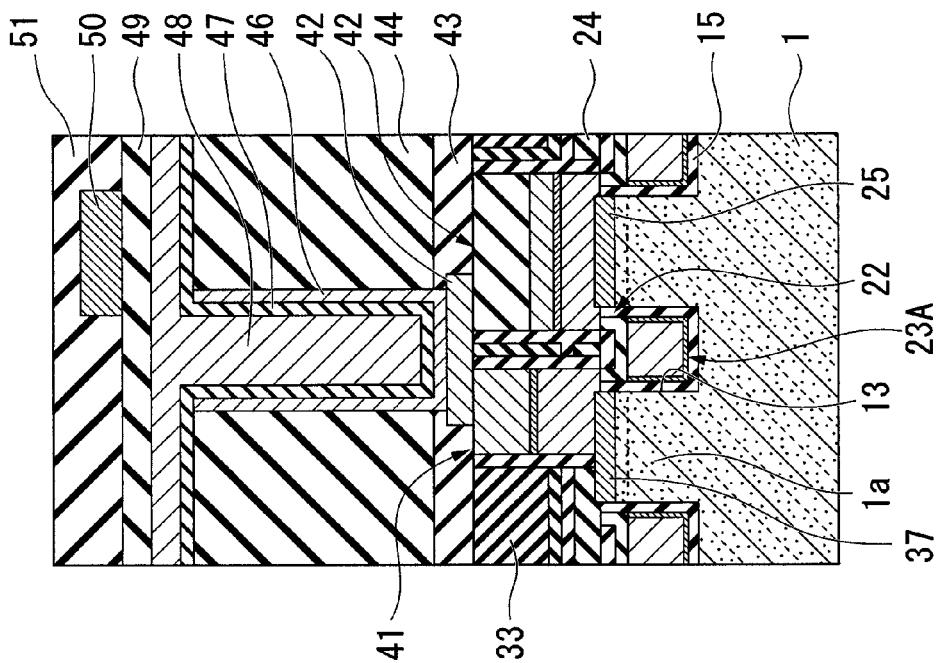
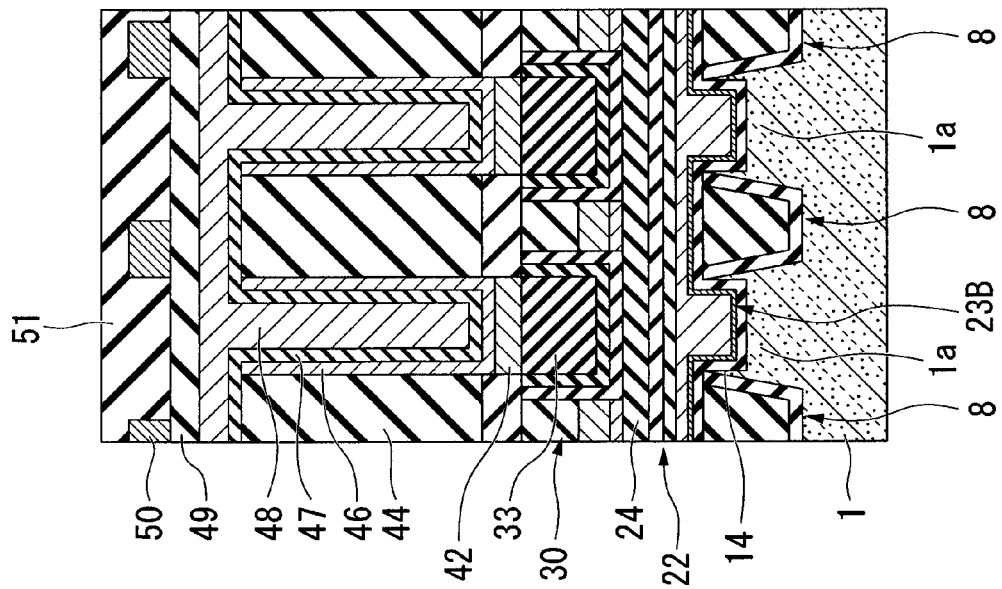

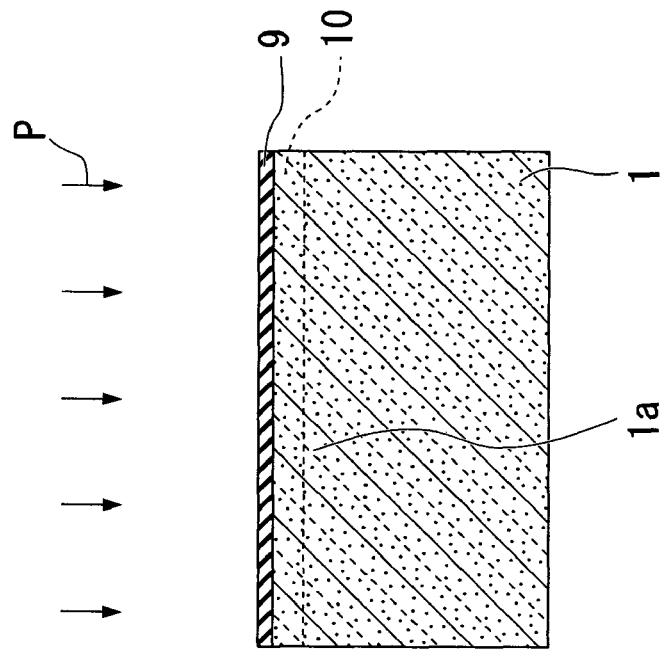

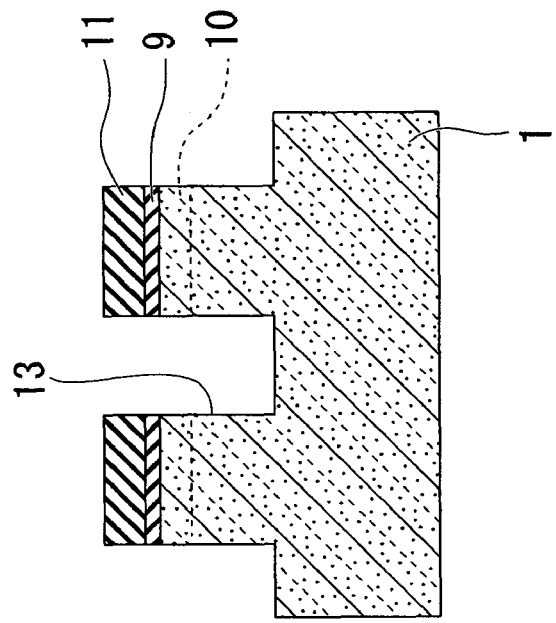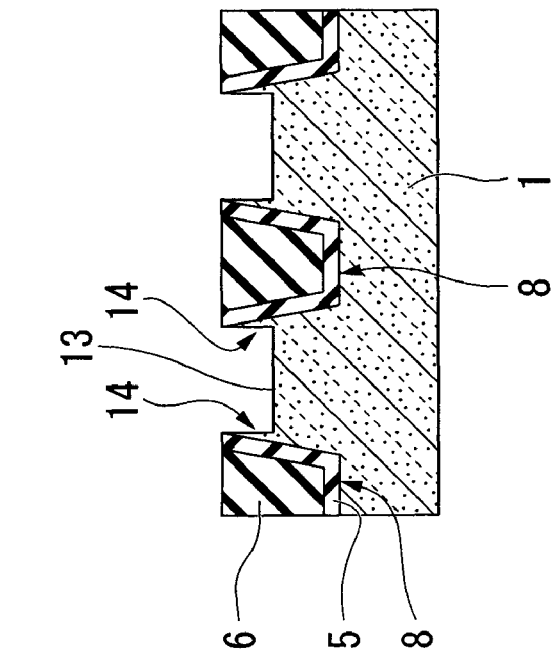

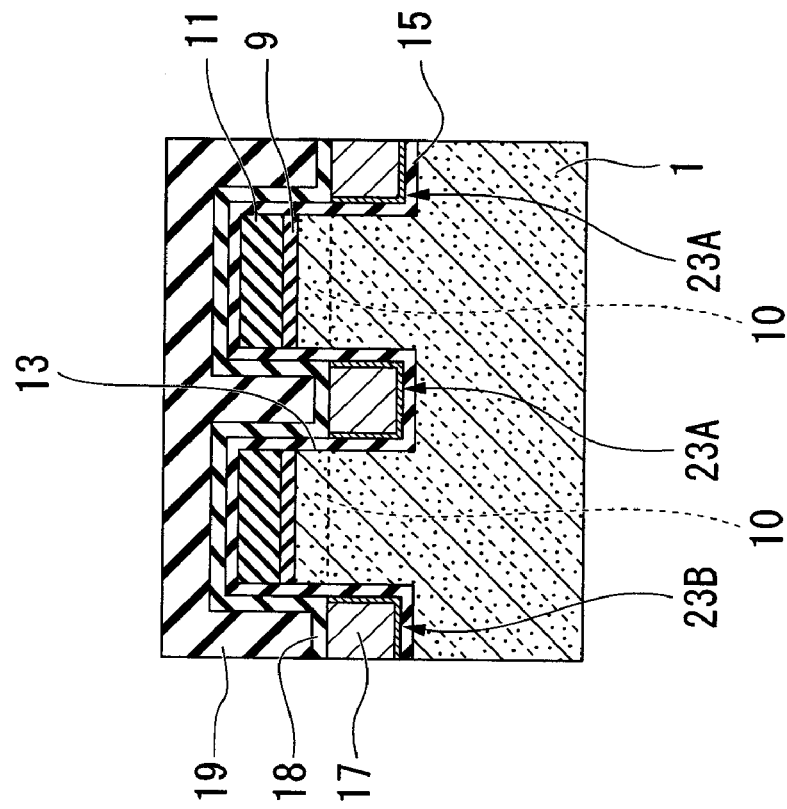
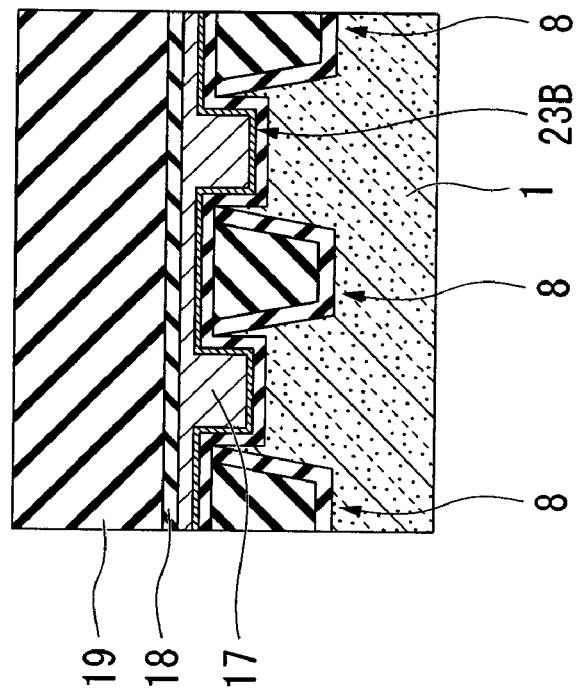

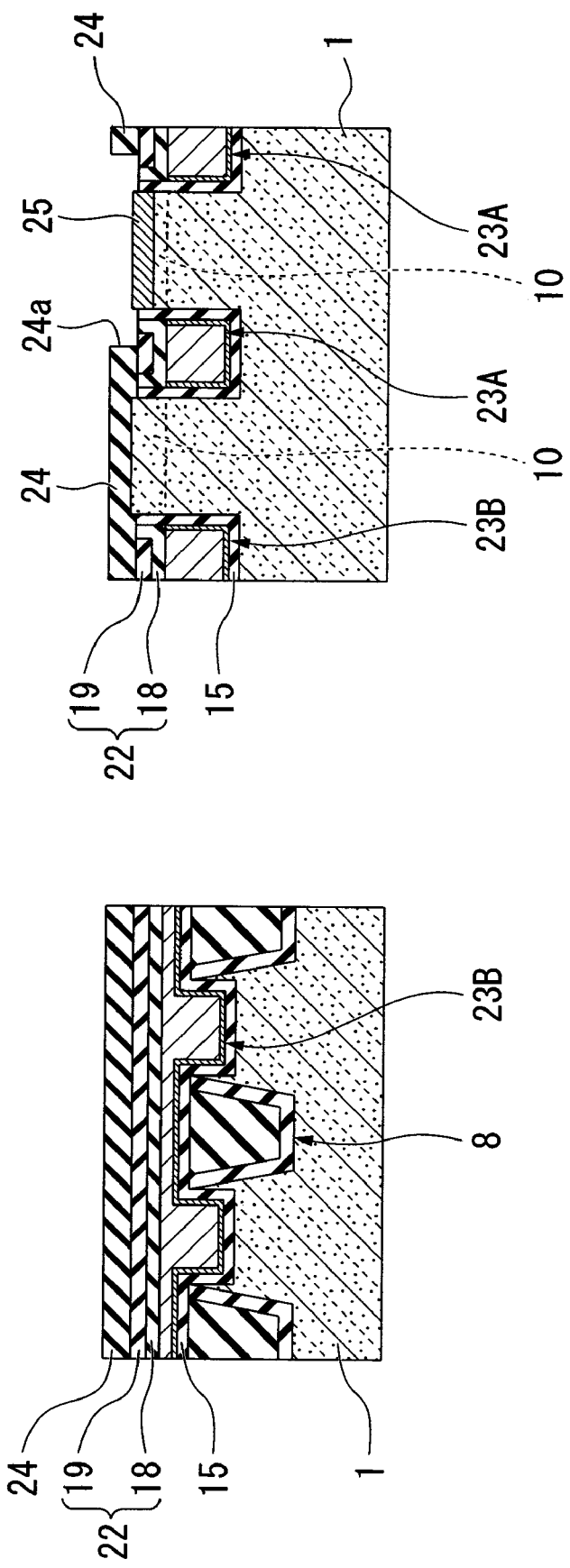

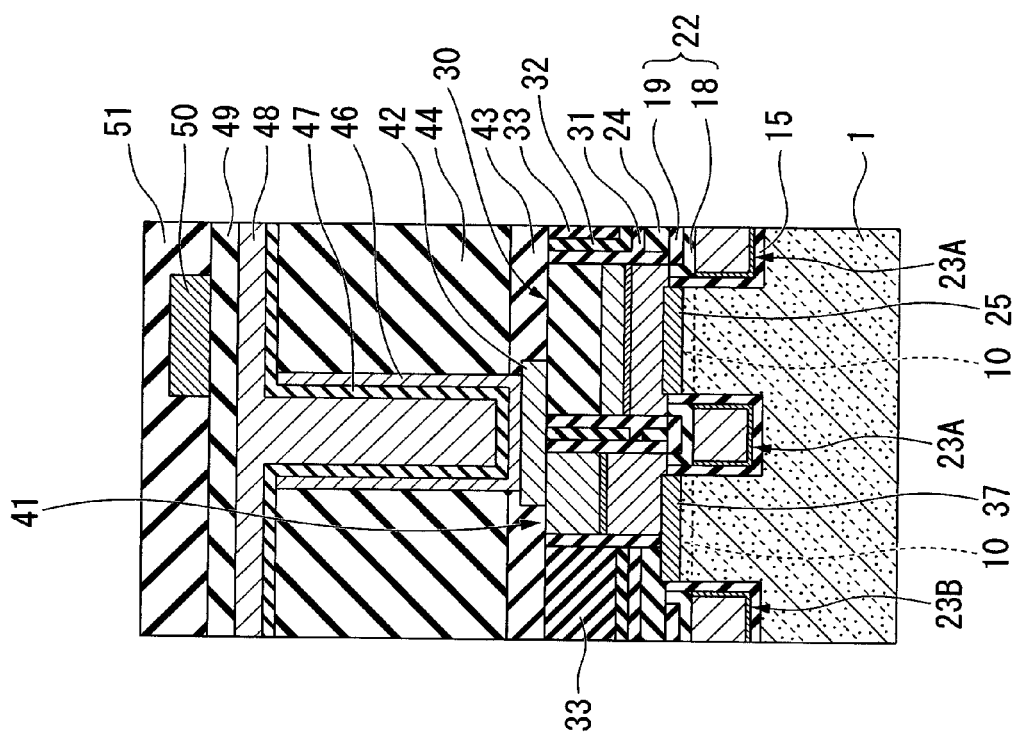
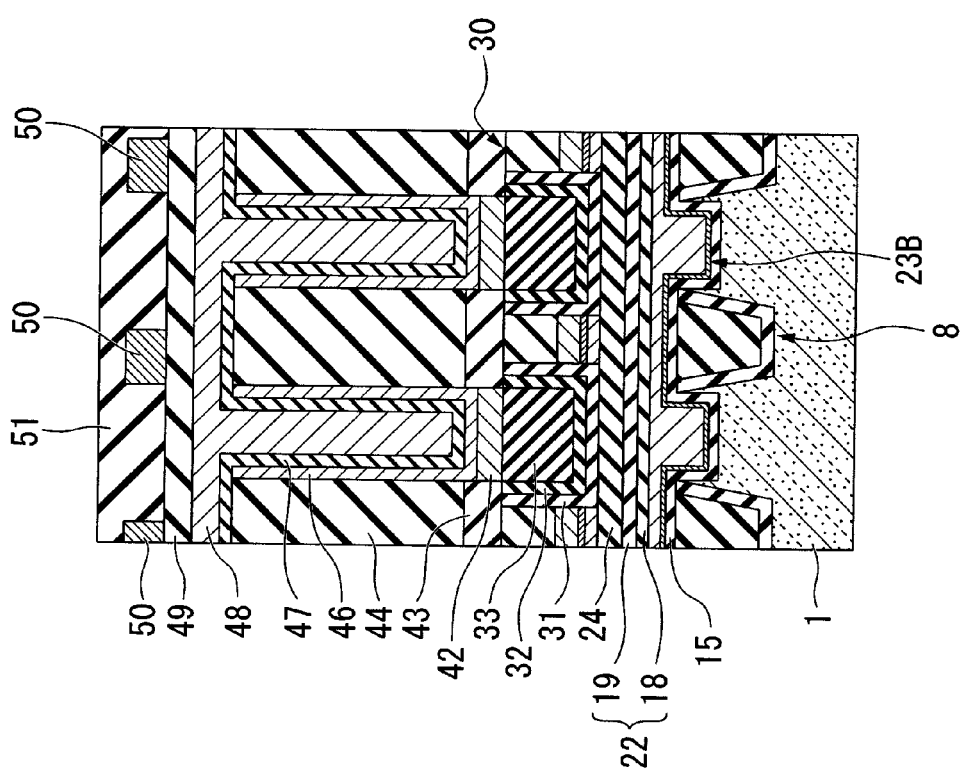

METHOD OF FORMING A SEMICONDUCTOR DEVICE

Priority is claimed on Japanese Patent Application No. 2009-283948, Dec. 15, 2009, the content of which is incorporated herein by reference.

BACKGROUND OF THE INVENTION

1. Field of the Invention

The present invention generally relates to a method of forming a semiconductor device.

2. Description of the Related Art

In the transistors with a planar structure the substrate surface is used as a channel in the related art. It has become difficult to suppress a short channel effect due to miniaturization of semiconductor devices, and desired transistor characteristics cannot be obtained.

Japanese Unexamined Patent Application, First Publications, Nos. JP-A-2006-339476 and JP-A-2007-081095 disclose using groove gate transistors to suppress the short channel effect.

In the groove gate transistors described in Japanese Unexamined Patent Application, First Publication, No. JP-A-2006-339476 and JP-A-2007-081095, surfaces of grooves formed in a semiconductor substrate are used as channels. Accordingly, an amount of reduction in the planar dimension can be compensated for with expansion in the depth direction of the groove, and it is possible to suppress the short channel effect.

SUMMARY

In one embodiment, a method of forming a semiconductor device may include, but is not limited to, the following processes. A groove is formed in a semiconductor substrate. A gate insulating film is formed on an inside wall of the groove. A buried gate electrode is formed on the gate insulating film. The buried gate electrode is formed on a bottom portion of the groove. A cap insulating film is formed in an upper portion of the groove. The cap insulating film covers the buried gate electrode. The cap insulating film has a top surface which is different in level from a top surface of the semiconductor substrate. A first inter-layer insulating film is formed on the top surface of the semiconductor substrate and on the top surface of the cap insulating film. The first inter-layer insulating film fills a gap in level between the top surface of the semiconductor substrate and the top surface of the cap insulating film. The first inter-layer insulating film has a flat top surface.

In another embodiment, a method of forming a semiconductor device may include, but is not limited to, the following processes. A groove is formed in a semiconductor substrate. A gate insulating film is formed on an inside wall of the groove. A buried gate electrode is formed on the gate insulating film. The buried gate electrode is disposed on a bottom portion of the groove. A cap insulating film is formed in an upper portion of the groove. The cap insulating film covers the buried gate electrode. The cap insulating film has a top surface which is different in level from a top surface of the semiconductor substrate. A high density plasma deposition process is carried out to form a plasma oxide inter-layer insulating film on the top surface of the semiconductor substrate and on the top surface of the cap insulating film.

In still another embodiment, a method of forming a semiconductor device may include, but is not limited to, the following processes. A groove is formed in a semiconductor substrate. A gate insulating film is formed on an inside wall of the groove. A buried gate electrode is formed on the gate insulating film. The buried gate electrode is positioned on a bottom portion of the groove. A cap insulating film is formed in an upper portion of the groove. The cap insulating film covers the buried gate electrode. The cap insulating film has a top surface which is different in level from a top surface of the semiconductor substrate. A high density plasma deposition process is carried out to form a plasma oxide inter-layer insulating film on the top surface of the semiconductor substrate and on the top surface of the cap insulating film. The plasma oxide inter-layer insulating film fills a gap in level between the top surface of the semiconductor substrate and the top surface of the cap insulating film. The first inter-layer insulating film has a flat top surface. A first contact hole is formed in the first inter-layer insulating film. A conductive layer is formed on the plasma oxide inter-layer insulating film and in the first contact hole. The conductive layer is formed in the first contact hole contacting the top surface of the semiconductor substrate. A single patterning process is carried out to pattern the conductive layer to form a patterned conductive layer in the first contact hole.

BRIEF DESCRIPTION OF THE DRAWINGS

The above features and advantages of the present invention will be more apparent from the following description of certain preferred embodiments taken in conjunction with the accompanying drawings, in which:

FIG. 2A is a fragmentary cross sectional elevation view, taken along an A-A line of FIG. 1, illustrating a memory cell in the semiconductor device of FIG. 1;

FIG. 2B is a fragmentary cross sectional elevation view, taken along a B-B line of FIG. 1, illustrating a memory cell in the semiconductor device of FIG. 1;

FIG. 6A is a fragmentary cross sectional elevation view, taken along an A-A line of FIG. 1, illustrating a memory cell in a step, subsequent to the step of FIGS. 5A and 5B, involved in the method of forming the semiconductor device of FIGS. 1, 2A and 2B;

FIG. 6B is a fragmentary cross sectional elevation view, taken along a B-B line of FIG. 1, illustrating a memory cell in a step, subsequent to the step of FIGS. 5A and 5B, involved in the method of forming the semiconductor device of FIGS. 1, 2A and 2B;

FIG. 8A is a fragmentary cross sectional elevation view, taken along an A-A line of FIG. 1, illustrating a memory cell in a step, subsequent to the step of FIGS. 7A and 7B, involved in the method of forming the semiconductor device of FIGS. 1, 2A and 2B;

FIG. 8B is a fragmentary cross sectional elevation view, taken along a B-B line of FIG. 1, illustrating a memory cell in a step, subsequent to the step of FIGS. 7A and 7B, involved in the method of forming the semiconductor device of FIGS. 1, 2A and 2B;

FIG. 11A is a fragmentary cross sectional elevation view, taken along an A-A line of FIG. 1, illustrating a memory cell in a step, subsequent to the step of FIGS. 10A and 10B, involved in the method of forming the semiconductor device of FIGS. 1, 2A and 2B;

FIG. 11B is a fragmentary cross sectional elevation view, taken along a B-B line of FIG. 1, illustrating a memory cell in a step, subsequent to the step of FIGS. 10A and 10B, involved in the method of forming the semiconductor device of FIGS. 1, 2A and 2B;

FIG. 14A is a fragmentary cross sectional elevation view, taken along an A-A line of FIG. 1, illustrating a memory cell in a step, subsequent to the step of FIGS. 13A and 13B, involved in the method of forming the semiconductor device of FIGS. 1, 2A and 2B;

FIG. 14B is a fragmentary cross sectional elevation view, taken along a B-B line of FIG. 1, illustrating a memory cell in a step, subsequent to the step of FIGS. 13A and 13B, involved in the method of forming the semiconductor device of FIGS. 1, 2A and 2B;

FIG. 25A is a fragmentary cross sectional elevation view, taken along an A-A line of FIG. 1, illustrating a memory cell in a step, subsequent to the step of FIGS. 24A and 24B, involved in the method of forming the semiconductor device of FIGS. 1, 2A and 2B;

FIG. 25B is a fragmentary cross sectional elevation view, taken along a B-B line of FIG. 1, illustrating a memory cell in a step, subsequent to the step of FIGS. 24A and 24B, involved in the method of forming the semiconductor device of FIGS. 1, 2A and 2B;

DETAILED DESCRIPTION OF THE PREFERRED EMBODIMENTS

Figure 1:
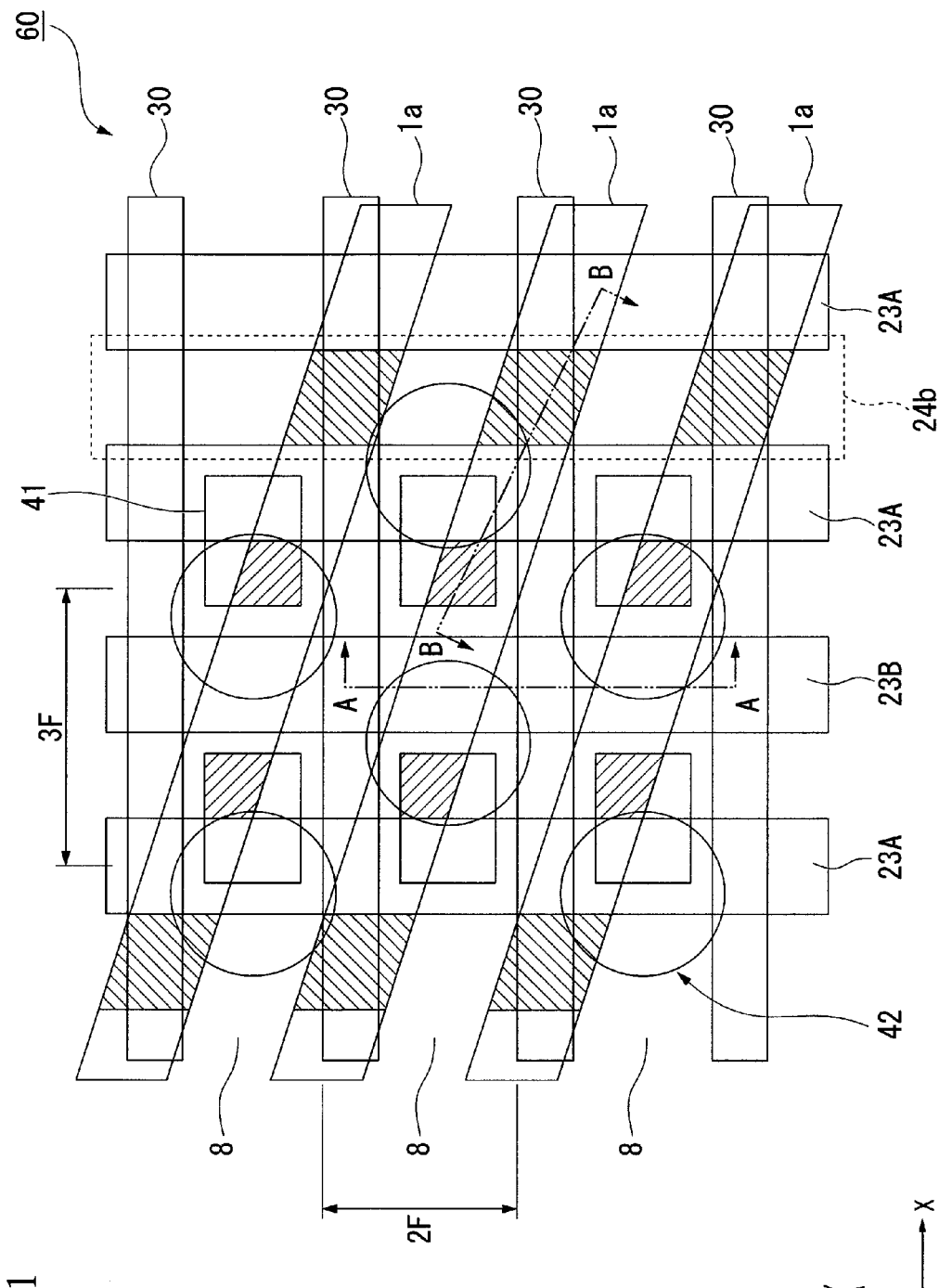
FIG. 1 is a fragmentary plan view illustrating a semiconductor device in accordance with a first preferred embodiment of the present invention.

Before describing the present invention, the related art will be explained in detail, in order to facilitate the understanding of the present invention.

In the groove gate transistors in the related art described in JP-A-2006-339476 and JP-A-2007-081095, gate electrodes protrude above the surface of the semiconductor substrate. Deterioration in transistor characteristics may be caused by misalignment when processing the gate electrodes with respect to the groove. Particularly, in a DRAM (Dynamic Random Access Memory) with a configuration in which the gate electrodes are used as word lines and bit lines provided in a direction intersecting with the word lines, contact plugs connecting the semiconductor substrate to upper layer lines have to be formed between the word lines formed respectively in a minimum processing dimension, and difficulty in forming the contact plugs is a significant obstacle in miniaturization of the DRAM.

Accordingly, to easily form the contact plugs, embedded gate transistors have been examined in which the gate electrodes are completely embedded in grooves without protruding above the surface of the semiconductor substrate. In the embedded gate transistors, the word lines are embedded in the semiconductor substrate. Accordingly, only the bit lines as lines constituting memory cells are positioned above the surface of the semiconductor substrate, and there is an advantage that it is possible to reduce the difficulty in processing in a memory cell forming process. The embedded gate transistor includes at least gate electrodes (word lines) formed to be embedded in grooves formed in the semiconductor substrate, a cap insulating film protecting upper faces of the gate electrode in the grooves and having an upper face substantially flush with the surface of the semiconductor substrate, and bit lines formed on the upside with an interlayer insulating film covering the surface of the semiconductor substrate interposed therebetween.

In the embedded gate structure, it is necessary to perform etch-back on a cap insulating film to form a structure so as to embed the cap insulating film protecting embedded gate electrodes. Accordingly, a level difference occurs between a surface of a semiconductor substrate and an upper face of the cap insulating film.

In the related art, a CVD oxide film is used in an interlayer insulating film formed on the surface of the semiconductor substrate when forming bit lines.

However, since the CVD oxide film is formed in a form which traces an underlying shape, a level difference also occurs on the surface of the interlayer insulating film when the interlayer insulating film is formed on the surface of the semiconductor substrate having the level difference using the CVD oxide film. When bit contact plugs or bit lines are formed using the interlayer insulating film having such a level difference, the amount of etching increases, recession of a mask becomes large, and the processing margin decreases.

Wet etching resistance of the CVD oxide film is low, there is widening of the opening width of a pattern formed on the interlayer insulating film such as bit contact plugs or the like at the pretreatment time when forming a line layer, and thus the process margin decreases.

In addition, in the related art, bit contact plugs and bit lines have been formed by with separate lithography and dry etching. In this case, a diameter of the plug becomes larger than the line width, and there is misalignment of the bit contact plugs and the bit lines. Accordingly, a problem of a short circuit with respect to another conductor easily occurs.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a method of forming a semiconductor device may include, but is not limited to, the following processes. A groove is formed in a semiconductor substrate. A gate insulating film is formed on an inside wall of the groove. A buried gate electrode is formed on the gate insulating film. The buried gate electrode is formed on a bottom portion of the groove. A cap insulating film is formed in an upper portion of the groove. The cap insulating film covers the buried gate electrode. The cap insulating film has a top surface which is different in level from a top surface of the semiconductor substrate. A first inter-layer insulating film is formed on the top surface of the semiconductor substrate and on the top surface of the cap insulating film. The first inter-layer insulating film fills a gap in level between the top surface of the semiconductor substrate and the top surface of the cap insulating film. The first inter-layer insulating film has a flat top surface.

In some cases, forming the first inter-layer insulating film may include, but is not limited to, carrying out a high density plasma deposition process.

In some cases, forming the first inter-layer insulating film may include, but is not limited to, forming a plasma oxide film.

In some cases, the method may further include, but is not limited to, carrying out a chemical mechanical polishing process that polishes the flat top surface of the first inter-layer insulating film.

In some cases, the method may further include, but is not limited to, forming a first contact hole in the first inter-layer insulating film.

In some cases, the method may further include, but is not limited to, introducing an impurity through the first contact hole into the top surface of the semiconductor layer, using the first inter-layer insulating film as a mask, to form a diffusion layer in the top surface of the semiconductor layer, and the diffusion layer being positioned under the first contact hole.

In some cases, the method may further include, but is not limited to, forming a bit contact plug in the first contact hole, the bit contact plug contacting the diffusion layer.

In some cases, forming the bit contact plug may include, but is not limited to, forming a conductive layer, and carrying out a single patterning process. A conductive layer is formed on the first inter-layer insulating film and in the first contact hole. The conductive layer is positioned in the first contact hole contacting the diffusion layer. A single patterning process is carried out to pattern the conductive layer to form the bit contact plug in the first contact hole.

In some cases, the conductive layer may include, but is not limited to, a multi-layered conductive film.

In some cases, the method may further include, but is not limited to, forming a bit line in the first contact hole, the bit line contacting the diffusion layer.

In some cases, forming the bit line may include, but is not limited to, forming a conductive layer, and carrying out a single patterning process. A conductive layer is formed on the first inter-layer insulating film and in the first contact hole. The conductive layer is positioned in the first contact hole contacting the diffusion layer. A single patterning process is carried out to pattern the conductive layer to form the bit line in the first contact hole.

In some cases, the conductive layer may include, but is not limited to, a multi-layered conductive film.

In some cases, forming the buried gate electrode may include, but is not limited to, forming a multi-layered conductive film which is free of polysilicon.

In some cases, forming the buried gate electrode may include, but is not limited to, forming a titanium nitride film on the gate insulating film; and forming a tungsten film on the titanium nitride film.

In some cases, forming the groove may include, but is not limited to, forming a trench groove that extends across an active region of the semiconductor device.

In another embodiment, a method of forming a semiconductor device may include, but is not limited to, the following processes. A groove is formed in a semiconductor substrate. A gate insulating film is formed on an inside wall of the groove. A buried gate electrode is formed on the gate insulating film. The buried gate electrode is disposed on a bottom portion of the groove. A cap insulating film is formed in an upper portion of the groove. The cap insulating film covers the buried gate electrode. The cap insulating film has a top surface which is different in level from a top surface of the semiconductor substrate. A high density plasma deposition process is carried out to form a plasma oxide inter-layer insulating film on the top surface of the semiconductor substrate and on the top surface of the cap insulating film.

In some cases, carrying out the high density plasma deposition method may include, but is not limited to, forming the plasma oxide inter-layer insulating film that fills a gap in level between the top surface of the semiconductor substrate and the top surface of the cap insulating film, the first inter-layer insulating film having a flat top surface.

In some cases, the method may include, but is not limited to, carrying out a chemical mechanical polishing process that polishes the flat top surface of the first inter-layer insulating film.

In some cases, the method may include, but is not limited to, the following processes. A first contact hole is formed in the first inter-layer insulating film. A conductive layer is formed on the plasma oxide inter-layer insulating film and in the first contact hole. The conductive layer is formed in the first contact hole contacting the top surface of the semiconductor substrate. A single patterning process is carried out to pattern the conductive layer to form a patterned conductive layer in the first contact hole.

In still another embodiment, a method of forming a semiconductor device may include, but is not limited to, the following processes. A groove is formed in a semiconductor substrate. A gate insulating film is formed on an inside wall of the groove. A buried gate electrode is formed on the gate insulating film. The buried gate electrode is positioned on a bottom portion of the groove. A cap insulating film is formed in an upper portion of the groove. The cap insulating film covers the buried gate electrode. The cap insulating film has a top surface which is different in level from a top surface of the semiconductor substrate. A high density plasma deposition process is carried out to form a plasma oxide inter-layer insulating film on the top surface of the semiconductor substrate and on the top surface of the cap insulating film. The plasma oxide inter-layer insulating film fills a gap in level between the top surface of the semiconductor substrate and the top surface of the cap insulating film. The first inter-layer insulating film has a flat top surface. A first contact hole is formed in the first inter-layer insulating film. A conductive layer is formed on the plasma oxide inter-layer insulating film and in the first contact hole. The conductive layer is formed in the first contact hole contacting the top surface of the semiconductor substrate. A single patterning process is carried out to pattern the conductive layer to form a patterned conductive layer in the first contact hole.

Hereinafter, a semiconductor device according to an embodiment of the invention will be described in detail with reference to the drawings. In the embodiment, an example of applying the invention to a DRAM (Dynamic Random Access Memory) as the semiconductor device will be described. In the drawings used for the following description, to easily understand characteristics, there is a case where characteristic parts are enlarged and shown for convenience' sake, and ratios of constituent elements may not be the same as in reality. Materials, sizes, and the like exemplified in the following description are just examples. The invention is not limited thereto and may be appropriately modified within a scope which does not deviate from the concept of the invention.

First, a configuration of a DRAM (semiconductor device) according to an embodiment of the invention will be described. The DRAM of the embodiment includes a memory cell area shown in FIG. 1 and a peripheral circuit area (not shown).

As shown in FIG. 1, in the memory cell area of the DRAM (semiconductor device) 60 of the embodiment, a plurality of active areas 1a, which are partitioned and surrounded with the element isolation area formed of an STI element isolation film 8, are formed at predetermined intervals in a predetermined direction. Embedded gate electrodes 23A, which are word lines, and an element isolation embedded line 23B are embedded at predetermined intervals in a predetermined direction (Y direction shown in FIG. 1) to longitudinally cross the active areas 1a. A plurality of bit lines 30 are provided at predetermined intervals in a direction (X direction shown in FIG. 1) perpendicular to the embedded gate electrodes 23A and the embedded line 23B. Memory cells are formed in each of the areas where the embedded gate electrodes 23A intersect the active areas 1a.

The embedded gate electrodes (word lines) 23A and the embedded line 23B have the same structure, but have different functions. The embedded gate electrodes 23A are used as gate electrodes of the memory cells. On the contrary, the element isolation embedded line 23B is provided to isolate adjacent transistors from each other over a predetermined potential. That is, the element isolation embedded line 23B is kept at a predetermined potential to turn off a parasitic transistor, such that the adjacent transistors in the same active area 1a are isolated from each other.

In the whole memory cell area, the plurality of memory cells are formed, each memory cell is provided with a capacitor element (not shown). As shown in FIG. 1, capacitance contact pads 42 of the memory cells are provided at predetermined intervals in the memory cell area so as not to overlap with each other.

As shown in FIG. 1, the DRAM 60 of the embodiment is provided in $6F^2$ cell disposition (F is a minimum processing dimension).

The memory cells constituting the DRAM 60 will of the embodiment be described.

As shown in FIG. 2A and FIG. 2B, the memory cell of the embodiment is a laminated structure in which embedded gate transistors formed of a semiconductor substrate in which word lines are completely embedded therein, capacitors, and a line layer are formed.

As shown in FIG. 2A and FIG. 2B, the embedded gate transistor includes a semiconductor substrate 1 having a surface layer formed of silicon, an STI element separation film 8 formed of an embedded insulating film formed in the semiconductor substrate 1, an active area 1a partitioned by the STI element isolation film 8, an embedded gate electrode 23A embedded with a gate insulating film 15 interposed therebetween at the bottom of a gate electrode groove 13, a cap insulating film 22 embedded in the gate electrode groove 13 to protect the upper face of the gate electrode 23A and having an upper face substantially flush with the surface of the semiconductor substrate 1, a bit line 30 formed on the upside with a first interlayer insulating film (interlayer insulating film) 24 covering the surface of the semiconductor substrate 1 interposed therebetween.

The embedded gate transistor is provided with diffusion areas 25 and 37 formed by injecting ions to the active areas 1a on both widthwise sides of the embedded gate electrode 23A, and is connected to the diffusion area 25 and the bit line 30.

As shown in FIG. 2A, in the embedded gate transistor of the embodiment, a part of the bottom face of the embedded line 23B is embedded between the adjacent STI element isolation film 8 provided in a lengthwise direction of the embedded line 23B. Accordingly, a thin film silicon portion 14 is formed in a side-wall shape between the STI element isolation film 8 and a part of the side face of the bottom face where the embedded line 23B is embedded.

Since the embedded gate electrode 23A and the embedded line 23B have the same structure, the same thin film silicon portion 14 is also provided on a part of the bottom face of the embedded gate electrode 23A. The thin film silicon portion 14 can serve as a channel when a potential difference between a source area and a drain area exceeds a threshold value. As described above, the embedded gate transistor of the embodiment constitutes a recess channel type transistor having a channel area such the thin film silicon portion 14.

A capacitor is provided above the embedded gate transistor with an insulating film 33 and the like interposed therebetween. Specifically, a capacitance contact pad 42, which is connected to a diffusion area 37 of the embedded gate transistor through a capacitance contact plug 41, is provided on the insulating film 33. A capacitor, which includes a lower electrode 46, a capacitance insulating film 47, and an upper electrode 48 provided to pass through a stopper film 43 and a third interlayer insulating film 44, is formed on the capacitance contact pad 42.

A cylinder type using only an inner wall of the lower electrode 46 as an electrode is described as an example of the capacitor element of the embodiment, but it is not limited thereto. For example, it may be modified into a crown type capacitor using an inner wall and an outer wall of the lower electrode as electrodes.

The line layer is provided on the capacitor with a fourth interlayer insulating film 49 interposed therebetween, and includes upper metal lines 50 and a protective film 51. In the embodiment, a case where the line layer is a one-layer line structure is described as an example, but it is not limited thereto. For example, it may be modified into a multi-layer line structure formed of a plurality of line layers and interlayer insulating films.

Subsequently, a method of manufacturing the DRAM (semiconductor device) 60 having the above-described configuration will be described with reference to FIG. 3A to FIG. 26. FIG. 3A to FIG. 26 are views showing the method of manufacturing the DRAM of the embodiment. In each figure, A shows a cross-sectional structure taken along the line A-A' shown in FIG. 1, and B shows a cross-sectional structure taken along the line B-B' shown in FIG. 1.

The method of manufacturing the DRAM (semiconductor device) 60 of the embodiment includes a process of forming element isolation areas, a process of forming embedded gate electrodes, a process of forming bit lines, a process of forming capacitance contact plugs, a process of forming capacitors, and a process of forming a line layer.

More specifically, the method of manufacturing the DRAM 60 of the embodiment includes a process of forming gate electrode grooves in the semiconductor substrate, a process of forming a gate insulating film on the inner faces of the gate electrode grooves, a process of filling the insides of the gate electrode grooves with a gate electrode material, a process of performing etch-back, and then forming embedded gate electrodes at the bottoms of the gate electrode grooves, a process of filling the insides of the gate electrode grooves with an insulating film to cover the upper faces of the embedded gate electrodes, performing etch-back, and then forming a cap insulating film at the upper portions of the gate electrodes grooves, a process of forming an interlayer insulating film on the upper face of the semiconductor substrate, and a process of forming bit contact opening portions in the interlayer insulating film. In the process of forming the interlayer insulating film on the upper face of the semiconductor substrate, the interlayer insulating film is formed to fill a level difference formed between the upper face of the semiconductor substrate and the upper face of the cap insulating film, and the upper face of the interlayer insulating film is made into a flat face.

Hereinafter, the processes will be described in detail.
(Process of Forming Element Isolation Areas)

Figure 3A:
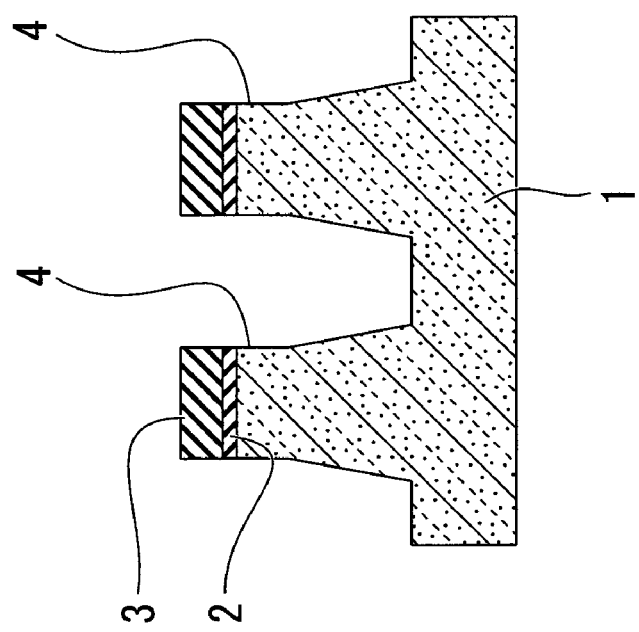
FIG. 3A is a fragmentary cross sectional elevation view, taken along an A-A line of FIG. 1, illustrating a memory cell in a step involved in a method of forming the semiconductor device of FIGS. 1, 2A and 2B.
Figure 3B:
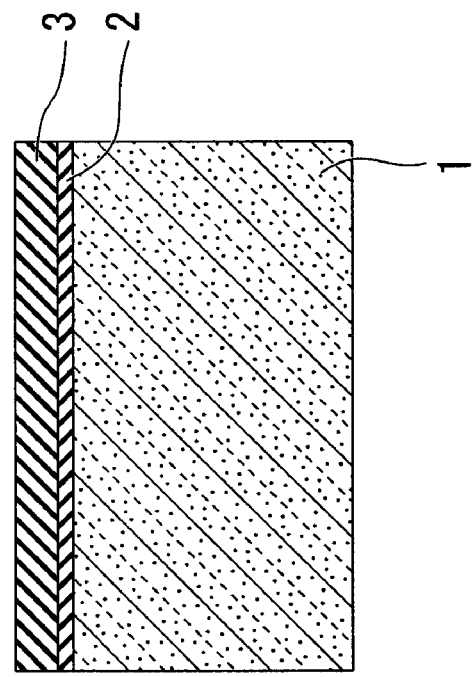
FIG. 3B is a fragmentary cross sectional elevation view, taken along a B-B line of FIG. 1, illustrating a memory cell in a step involved in a method of forming the semiconductor device of FIGS. 1, 2A and 2B.

First, element isolation areas for isolating active areas 1a are formed on a surface of a silicon substrate (semiconductor substrate) 1. As shown in FIG. 3A and FIG. 3B, for example, the element isolation areas are formed by sequentially laminating a silicon oxide film ($SiO_2$) 2 and a silicon nitride film ($Si_3N_4$) 3 for a mask on the P type silicon substrate (semiconductor substrate) 1. Then, patterning of a silicon nitride film 3, a silicon nitride film 2, and the silicon substrate 1 is sequentially performed using photolithography technique and dry etching technique to form element isolation grooves (trenches) 4 for partitioning the active areas 1a on the silicon substrate 1. The silicon surface, which becomes the active areas 1a, of the silicon substrate 1 is covered with the silicon nitride film 3 for a mask.

Figure 4B:
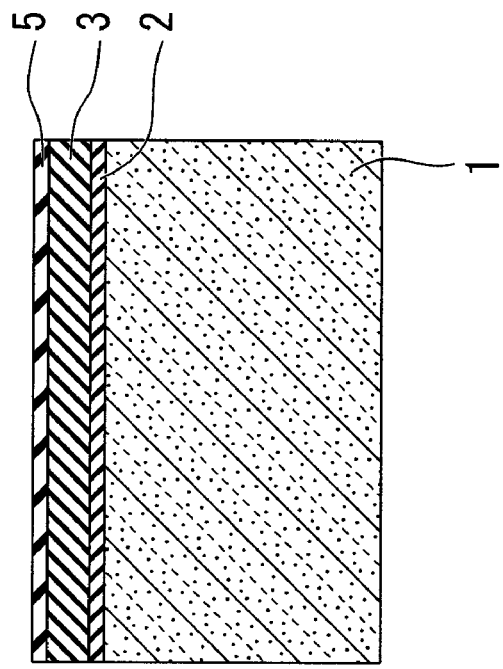
FIG. 4B is a fragmentary cross sectional elevation view, taken along a B-B line of FIG. 1, illustrating a memory cell in a step, subsequent to the step of FIGS. 3A and 3B, involved in the method of forming the semiconductor device of FIGS. 1, 2A and 2B.
Figure 4A:
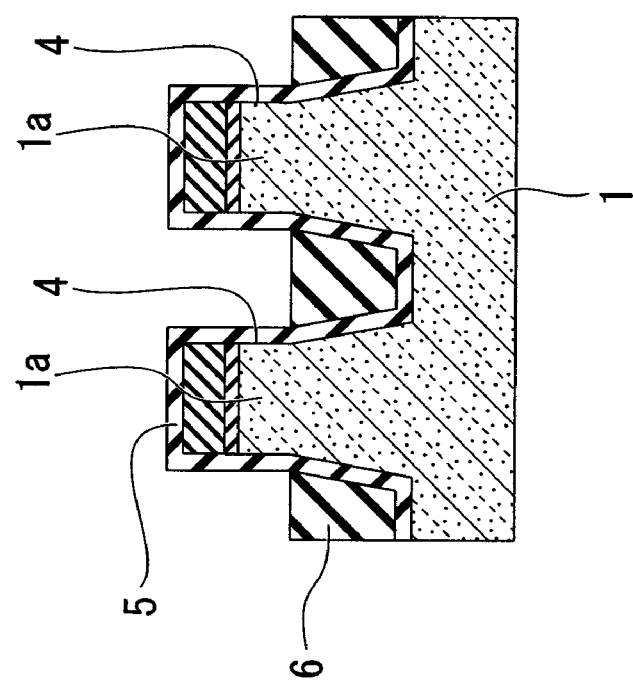
FIG. 4A is a fragmentary cross sectional elevation view, taken along an A-A line of FIG. 1, illustrating a memory cell in a step, subsequent to the step of FIGS. 3A and 3B, involved in the method of forming the semiconductor device of FIGS. 1, 2A and 2B.

Then, as shown in FIG. 4A and FIG. 4B, a silicon oxide film 5 is formed on the surface of the silicon substrate 1 exposed into the element isolation grooves 4. Specifically, the silicon oxide film 5 is formed by thermal oxidation on the surface of the silicon nitride film 2 and the silicon nitride film 3 which coat the active areas 1a of the silicon substrate 1 together with the surface of the silicon substrate 1 in the element isolation grooves 4. Then, nitride silicon is laminated to fill the insides of the element isolation grooves 4, then etch-back is performed, and a silicon nitride film 6 remains at the bottoms in the element isolation grooves 4.

Figure 5B:
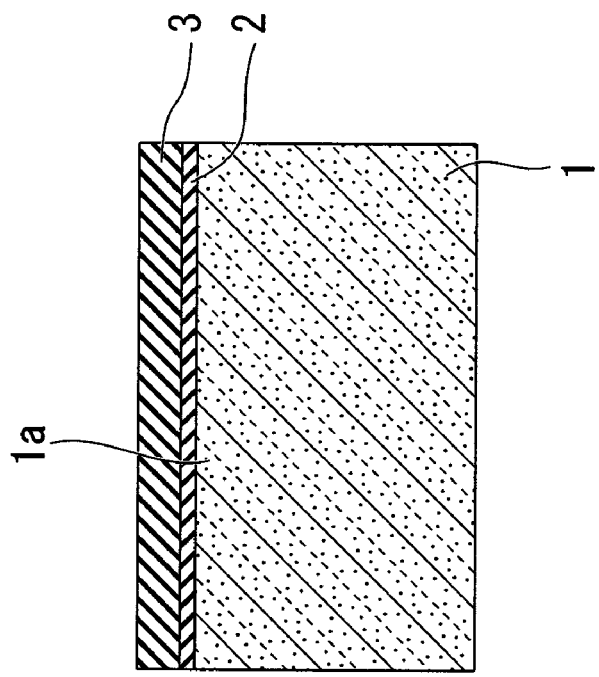
FIG. 5B is a fragmentary cross sectional elevation view, taken along a B-B line of FIG. 1, illustrating a memory cell in a step, subsequent to the step of FIGS. 4A and 4B, involved in the method of forming the semiconductor device of FIGS. 1, 2A and 2B.
Figure 5A:
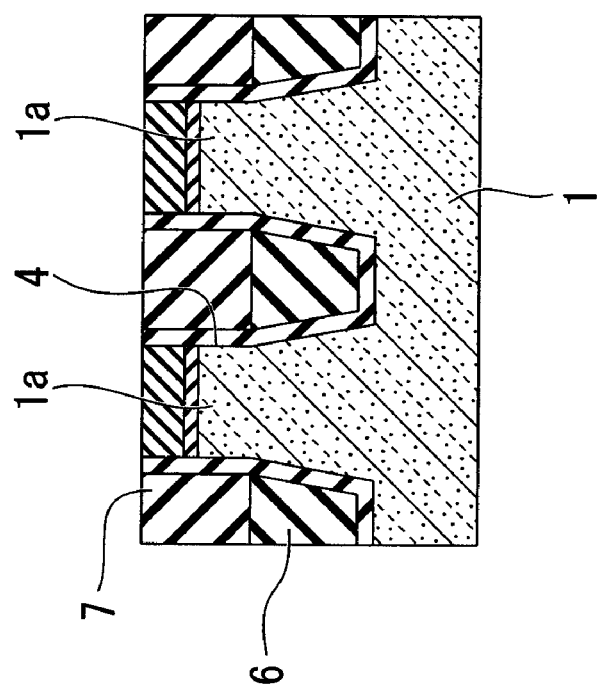
FIG. 5A is a fragmentary cross sectional elevation view, taken along an A-A line of FIG. 1, illustrating a memory cell in a step, subsequent to the step of FIGS. 4A and 4B, involved in the method of forming the semiconductor device of FIGS. 1, 2A and 2B.

Then, as shown in FIG. 5A and FIG. 5B, silicon oxide is laminated to fill the insides of the element isolation grooves 4 by, for example, a CVD method, and then CMP is performed to planarize the surface of the substrate until the silicon nitride film 3 used for a mask is exposed, thereby forming a silicon oxide film 7. As described above, the insides of the element isolation grooves 4 are filled with the 2-layer structure of the lower layer silicon nitride film 6 and the upper layer silicon oxide film 7, and thus it is possible to reliably fill the insides of the element isolation grooves 4 with the insulating film even when widths of the element isolation grooves 4 are very small.

Then, as shown in FIG. 6A and FIG. 6B, the silicon nitride film 3 used for a mask and the silicon oxide film 2 are removed by, for example, wet etching. Thus, the surface (i.e., the surface of the silicon oxide film 7) of the element isolation grooves 4 and the surface of the silicon substrate 1 become substantially flush with each other. In such a manner, a STI (Shallow Trench Isolation) element isolation film 8 constituting the element isolation areas is formed. The active areas 1a are partitioned in the silicon substrate 1 by the element isolation areas.

Then, an impurity diffusion layer is formed on the surface of the silicon substrate 1. The impurity diffusion layer is formed as follows. First, as shown in FIG. 6A and FIG. 6B, a silicon oxide film 9 is formed on the surface of the exposed silicon substrate 1 by thermal oxidation. Then, low-concentration N type impurities (phosphorus, and the like.) are injected to the active areas 1a of the silicon substrate 1 by ion injection using the silicon oxide film 9 as a mask. In such a manner, an N type impurity diffusion layer 10 is formed in the vicinity of the surface of the silicon substrate 1. The N type impurity diffusion layer 10 serves as a part of the source and drain areas of the transistors.

(Process of Forming Embedded Gate Electrodes)

Figure 7A:
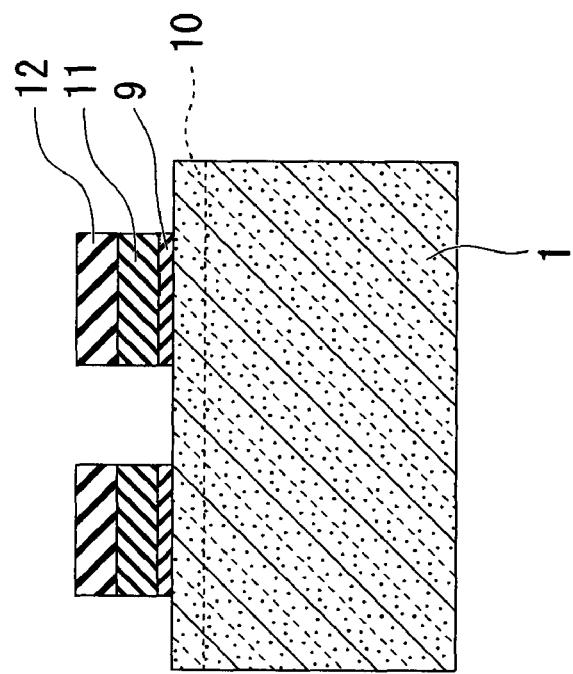
FIG. 7A is a fragmentary cross sectional elevation view, taken along an A-A line of FIG. 1, illustrating a memory cell in a step, subsequent to the step of FIGS. 6A and 6B, involved in the method of forming the semiconductor device of FIGS. 1, 2A and 2B.
Figure 7B:
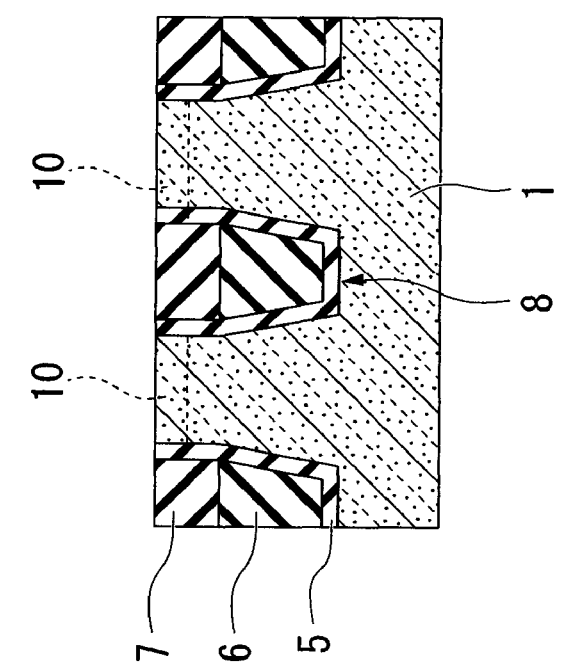
FIG. 7B is a fragmentary cross sectional elevation view, taken along a B-B line of FIG. 1, illustrating a memory cell in a step, subsequent to the step of FIGS. 6A and 6B, involved in the method of forming the semiconductor device of FIGS. 1, 2A and 2B.

Then, embedded gate electrodes (word lines) are formed. The embedded gate electrodes are formed as follows. As shown in FIG. 7A and FIG. 7B, a silicon nitride film 11 used for a mask and a carbon film (amorphous carbon film) 12 are sequentially laminated on the silicon oxide film 9, and then the carbon film 12, the silicon nitride film 11, and the silicon oxide film 9 are sequentially patterned to form a hard mask for forming gate electrode grooves (trenches).

As shown in FIG. 8A and FIG. 8B, the silicon substrate 1 exposed from the hard mask is etched by dry etching, and thus the gate electrodes grooves (trenches) 13 are formed. The gate electrodes grooves 13 are formed as a linear pattern extending in a predetermined direction (e.g., the Y direction in FIG. 1) intersecting with the active areas 1a. As shown in FIG. 8A, when the gate electrode grooves 13 are formed, the silicon layer part is etched deeper than the STI element isolation film 8 so that the surface of the STI element isolation film 8 is higher than the silicon substrate 1. Accordingly, thin film silicon portions 14 having a side-wall shape remain on the side parts of the gate electrode grooves 13 which come into contact with the STI element isolation film 8. The thin film silicon portions 14 serve as the channel areas of the transistors.

Figure 9B:
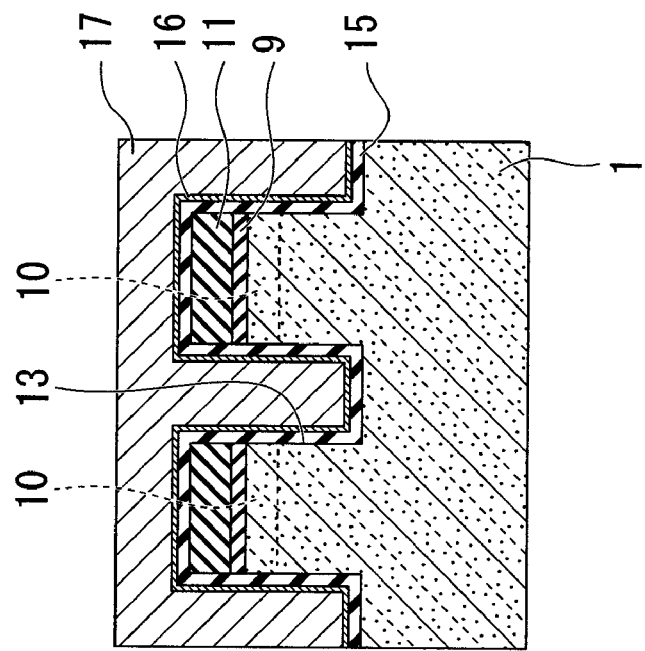
FIG. 9B is a fragmentary cross sectional elevation view, taken along a B-B line of FIG. 1, illustrating a memory cell in a step, subsequent to the step of FIGS. 8A and 8B, involved in the method of forming the semiconductor device of FIGS. 1, 2A and 2B.
Figure 9A:
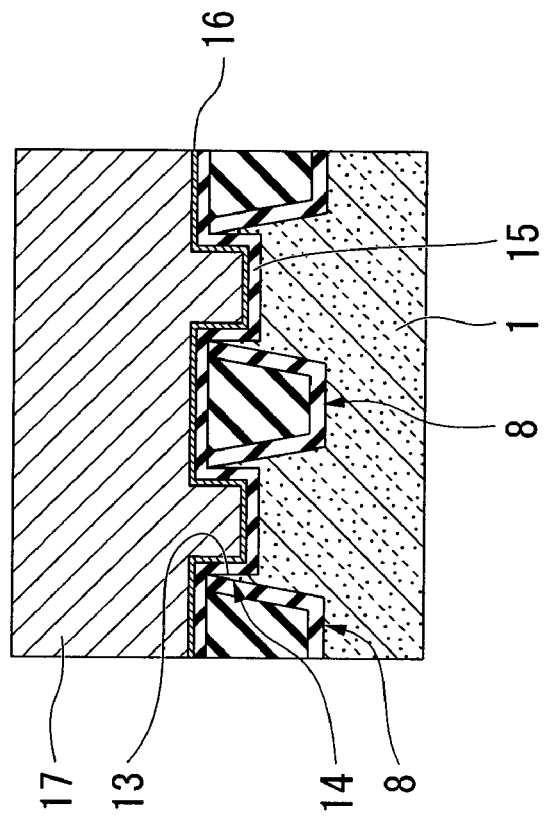
FIG. 9A is a fragmentary cross sectional elevation view, taken along an A-A line of FIG. 1, illustrating a memory cell in a step, subsequent to the step of FIGS. 8A and 8B, involved in the method of forming the semiconductor device of FIGS. 1, 2A and 2B.

Then, as shown in FIG. 9A and FIG. 9B, a gate insulating film 15 is formed to cover the inner wall faces of the gate electrode grooves 13 and the surface of the substrate. As the gate insulating film 15, for example, a silicon oxide film formed by thermal oxidation or the like may be used. Then, gate electrode materials are sequentially laminated on the gate insulating film 15 to fill the inside of the gate electrode grooves 13. Specifically, using, for example, titanium nitride (TiN) and tungsten (W) as the gate electrode materials, the inside of the gate electrode grooves 13 are filled with a titanium nitride film 16 and a tungsten film 17.

In the method of forming the gate electrodes in the related art, conductive polysilicon has been used at a part coming into contact with the gate insulating film 15. However, when the polysilicon is used for the miniaturized embedded gate electrodes, a resistance value of the gate electrodes becomes high, which is not preferable. Accordingly, in the embodiment, the inside of the gate electrode grooves 13 are filled only with titanium nitride and tungsten without using polysilicon.

Figure 10A:
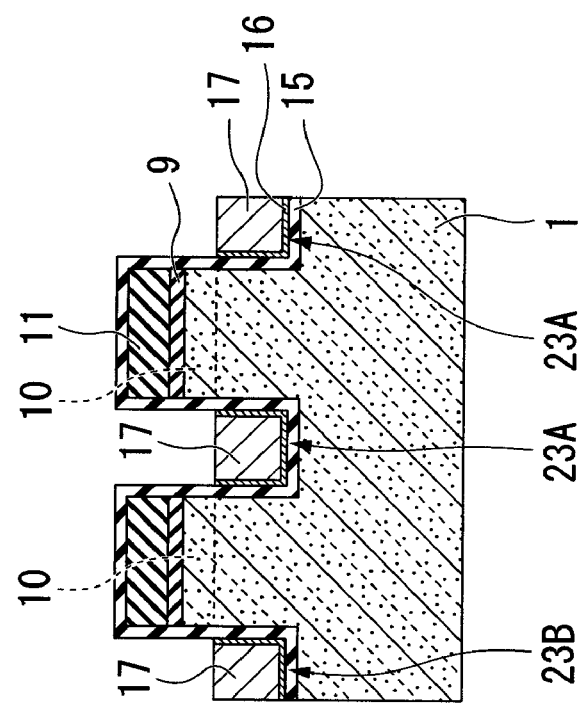
FIG. 10A is a fragmentary cross sectional elevation view, taken along an A-A line of FIG. 1, illustrating a memory cell in a step, subsequent to the step of FIGS. 9A and 9B, involved in the method of forming the semiconductor device of FIGS. 1, 2A and 2B.
Figure 10B:
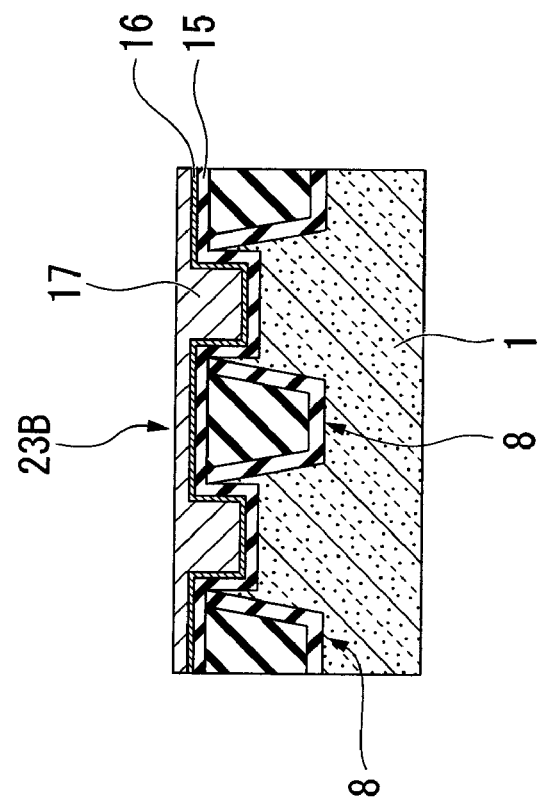
FIG. 10B is a fragmentary cross sectional elevation view, taken along a B-B line of FIG. 1, illustrating a memory cell in a step, subsequent to the step of FIGS. 9A and 9B, involved in the method of forming the semiconductor device of FIGS. 1, 2A and 2B.

As shown in FIG. 10A and FIG. 10B, etch-back is performed on the titanium nitride film 16 and the tungsten film 17 formed to fill the insides of the gate electrode grooves 13, and the titanium nitride film 16 and the tungsten film 17 remain only at the bottoms of the gate electrode grooves 13. In such a manner, the embedded gate electrodes (word lines) 23A and the embedded line 23B are formed to fill the insides of the gate electrode grooves 13 formed in the silicon substrate 1. To embed the gate electrodes, the amount of etch-back is adjusted such that the upper face of the tungsten film 17 constituting the embedded gate electrodes 23A in the gate electrode grooves 13 is positioned lower (deeper) than the silicon layer of the silicon substrate 1.

As shown in FIG. 11A and FIG. 11B, a liner film 18 is formed of, for example, a silicon nitride film or the like to cover the upside of the remaining tungsten film 17 and the inner walls of the gate electrodes grooves 13. Then, an embedded insulating film 19 is formed on the liner film 18. As the embedded insulating film 19, for example, a silicon oxide film formed by a CVD method, an SOD (Spin On Dielectric) film that is a coating film, and a laminated film thereof may be used. When the SOD film is used as the embedded insulating film 19, the SOD film is applied onto the liner film 18. Then an annealing process is performed in a high temperature atmosphere with water vapor ($H_2O$) to reform the SOD film into a solid film.

Figure 12A:
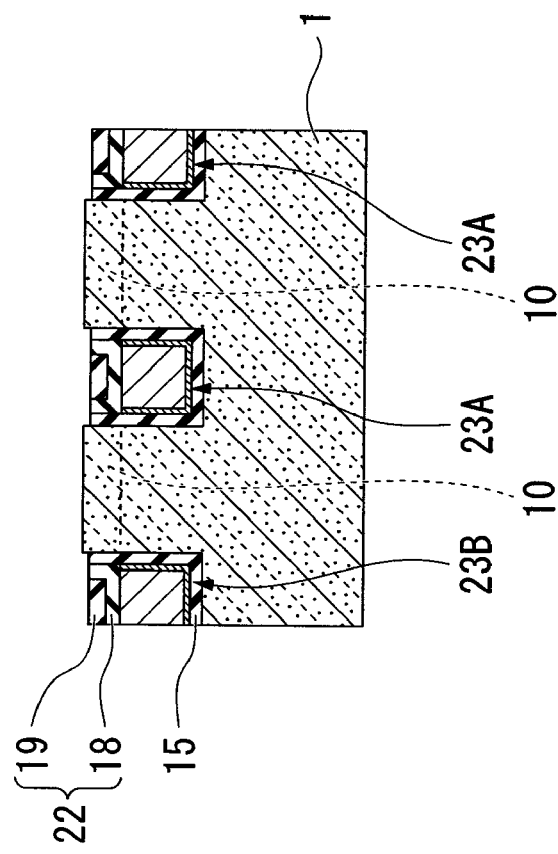
FIG. 12A is a fragmentary cross sectional elevation view, taken along an A-A line of FIG. 1, illustrating a memory cell in a step, subsequent to the step of FIGS. 11A and 11B, involved in the method of forming the semiconductor device of FIGS. 1, 2A and 2B.
Figure 12B:
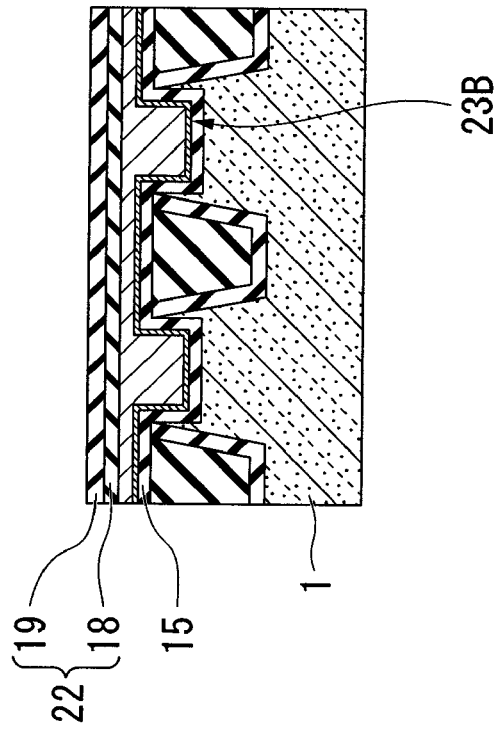
FIG. 12B is a fragmentary cross sectional elevation view, taken along a B-B line of FIG. 1, illustrating a memory cell in a step, subsequent to the step of FIGS. 11A and 11B, involved in the method of forming the semiconductor device of FIGS. 1, 2A and 2B.

As shown in FIG. 12A and FIG. 12B, a CMP process is performed and the surface of the substrate is planarized until the liner film 18 formed on the silicon nitride film 11 used for a mask is exposed. Thereafter, the silicon nitride film 11 used for a mask and a part of the embedded insulating film 19 and the liner film 18 are removed by etching (etch-back) to expose the silicon surface of the silicon substrate 1. In such a manner, a cap insulating film 22 formed of the liner film 18 and the embedded insulating film 19 is formed above the embedded gate electrodes (word lines) 23A and the embedded line 23B.

As described above, to form the cap insulating film 22 by performing etch-back of the silicon nitride film 11 and a part of the embedded insulating film 19 and the liner film 18, etching is performed such that the height (see FIG. 12A) of the surface of the embedded insulating film 19 is substantially the same as the height (see FIG. 12B) of the silicon surface of the silicon substrate 1.

However, as shown in FIG. 12B, a level difference occurs between the surface of the silicon substrate 1 and the upper face of the cap insulating film 22.

(Process of Forming Bit Lines)

Figure 13A:
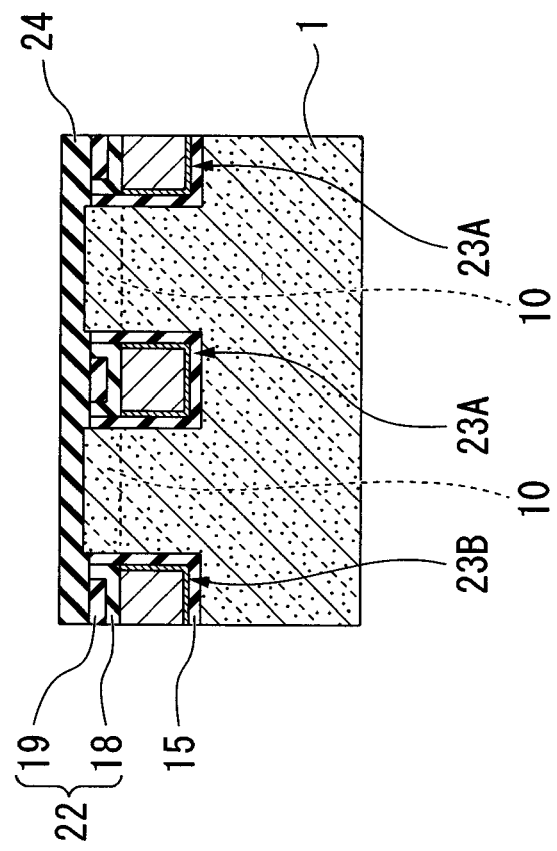
FIG. 13A is a fragmentary cross sectional elevation view, taken along an A-A line of FIG. 1, illustrating a memory cell in a step, subsequent to the step of FIGS. 12A and 12B, involved in the method of forming the semiconductor device of FIGS. 1, 2A and 2B.
Figure 13B:
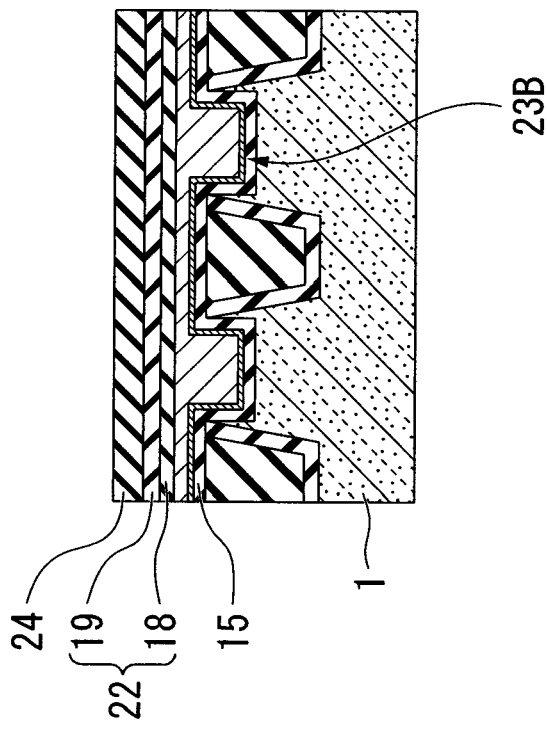
FIG. 13B is a fragmentary cross sectional elevation view, taken along a B-B line of FIG. 1, illustrating a memory cell in a step, subsequent to the step of FIGS. 12A and 12B, involved in the method of forming the semiconductor device of FIGS. 1, 2A and 2B.

Then, bit lines 30 are formed. The bit lines 30 are formed as follows. First, as shown in FIG. 13A and FIG. 13B, a first interlayer insulating film 24 is formed to cover the surface of the silicon substrate 1 and the surface of the cap insulating film 22.

The first interlayer insulating film 24 is formed such that an insulating film is formed to cover the level difference formed between the upper face of the silicon substrate 1 and the upper face of the cap insulating film 22, and is formed such that the upper face after the film is formed becomes a flat face.

In the method of manufacturing a semiconductor device of the related art, a CVD oxide film such as LP-TEOS is used as the first interlayer insulating film. However, since the CVD oxide film is formed to trace an underlying shape, a level difference between the surface of the silicon substrate 1 and the upper face of the cap insulating film 22 also occurs on the surface after the film is formed. For this reason, it was difficult to form the upper face of the first interlayer insulating film to be a flat face.

Thus, in the method of manufacturing the DRAM 60 of the embodiment, a plasma oxide film (HDP film) is used as the first interlayer insulating film 24. In the HDP (High Density Plasma) film forming method, the film forming is performed while cutting a film laminated (piled up) by overhanging on the upside of the groove using plasma active ions, and thus a level-difference covering property and a embedding property are high. Accordingly, using the HDP film as the first interlayer insulating film 24, it is possible to form the interlayer insulating film to cover the level difference formed between the upper face of the silicon substrate 1 and the upper face of the cap insulating film 22, and to make the upper face of the interlayer insulating film into a flat face.

When the plasma energy is too high when forming the HDP film, damage is applied to an N type impurity diffusion layer 10 formed in the vicinity of the surface of the silicon substrate 1 and there is a concern that the crystalline properties or the hold properties may deteriorate. Accordingly, deterioration of the hold properties is suppressed by appropriately controlling the plasma energy when forming the film.

As described above, by restricting the film forming condition of the HDP film, the upper face of the first interlayer insulating film 24 may be planarized by CMP after the film is formed where flatness of the upper face of the first interlayer insulating film 24 is not sufficient.

As shown in FIG. 14A and FIG. 14B, a part of the first interlayer insulating film 24 is removed using a photolithography technique and a dry etching technique so as to form a bit contact opening portion 24a.

For example, as shown in FIG. 1, the bit contact opening portion 24a is formed as a linear opening pattern 24b extending in the same direction (the Y direction shown in FIG. 1) as that of the word lines 23A. At a part where the bit contact opening pattern 24b intersects with the active area 1a, a silicon surface of the silicon substrate 1 is exposed from the bit contact opening portion 24a as shown in FIG. 14B.

Then, as shown in FIG. 14A and FIG. 14B, using the first interlayer insulating film 24 as a mask, N type impurities such as arsenic or the like are injected by ion injection into, for example, the surface of the silicon substrate 1 exposed from the bit contact opening portion 24a. Accordingly, an N type impurity diffusion layer is formed in the vicinity of the surface of the silicon substrate 1. The N type impurity diffusion layer becomes a diffusion area 25 serving as a part (in the embodiment, a drain area) of source and drain areas of the transistor. In the diffusion area 25 of the embodiment, it is preferable that an amount of ion injection ($N^+$) is made slightly larger than an amount (N) of ion injection when forming the N type impurity diffusion layer 10 to provide a concentration gradient, in order to adopt an LDD structure (Lightly Doped Drain).

Figure 15B:
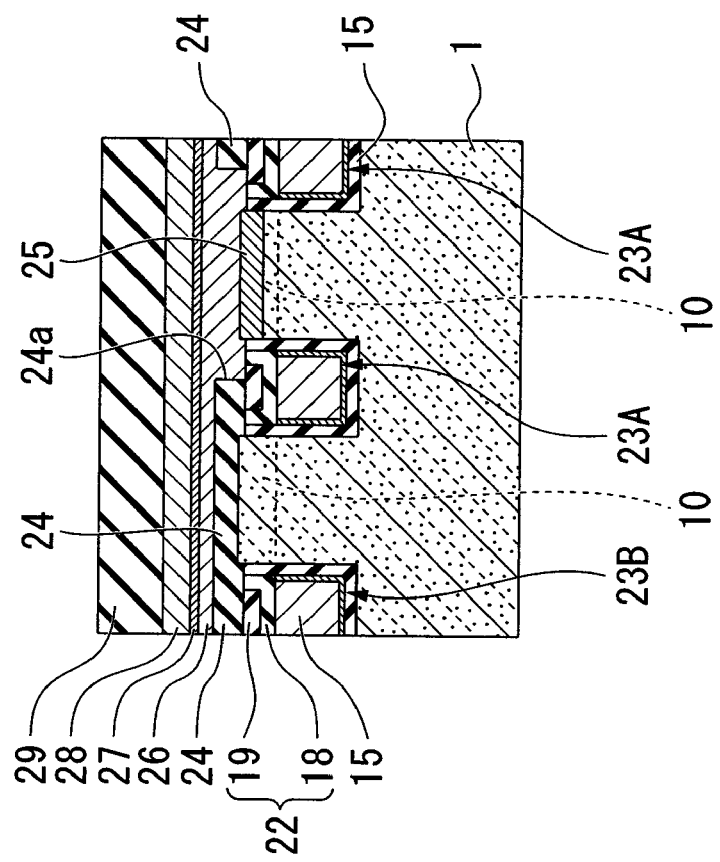
FIG. 15B is a fragmentary cross sectional elevation view, taken along a B-B line of FIG. 1, illustrating a memory cell in a step, subsequent to the step of FIGS. 14A and 14B, involved in the method of forming the semiconductor device of FIGS. 1, 2A and 2B.
Figure 15A:
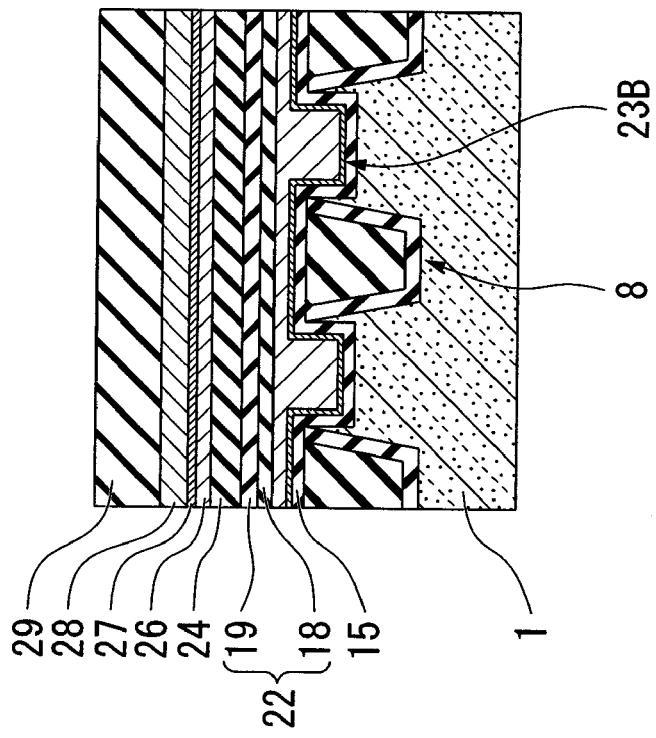
FIG. 15A is a fragmentary cross sectional elevation view, taken along an A-A line of FIG. 1, illustrating a memory cell in a step, subsequent to the step of FIGS. 14A and 14B, involved in the method of forming the semiconductor device of FIGS. 1, 2A and 2B.

As shown in FIG. 15A and FIG. 15B, polysilicon containing N type impurities such as phosphorous or the like are laminated on the first interlayer insulating film 24 to form a polysilicon film 26. In this case, the polysilicon is reliably embedded in the bit contact opening portion 24a. Then, tungsten silicide (WSi), tungsten, and a silicon nitride film are sequentially laminated on the polysilicon film 26 to respectively form a tungsten silicide film 27, a tungsten film 28, and a silicon nitride film 29.

Figure 16A:
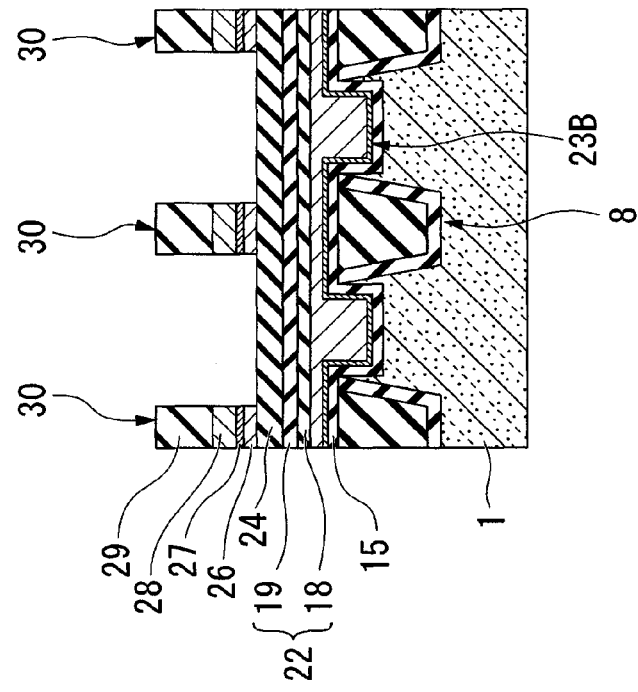
FIG. 16A is a fragmentary cross sectional elevation view, taken along an A-A line of FIG. 1, illustrating a memory cell in a step, subsequent to the step of FIGS. 15A and 15B, involved in the method of forming the semiconductor device of FIGS. 1, 2A and 2B.
Figure 16B:
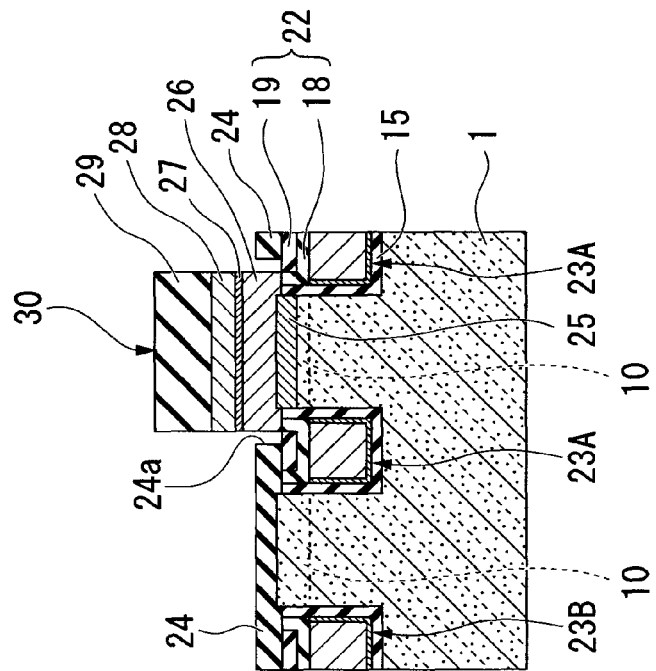
FIG. 16B is a fragmentary cross sectional elevation view, taken along a B-B line of FIG. 1, illustrating a memory cell in a step, subsequent to the step of FIGS. 15A and 15B, involved in the method of forming the semiconductor device of FIGS. 1, 2A and 2B.

Then, as shown in FIG. 16A and FIG. 16B, the laminated film formed of the polysilicon film 26, the tungsten silicide film 27, the tungsten film 28, and the silicon nitride film 29 is linearly patterned to form the bit lines 30.

The bit lines 30 are connected to the diffusion area 25 which becomes a part of the source and drain areas in the bit contact opening portion 24a. That is, the polysilicon film 26 constituting the bit lines 30 is connected to the diffusion area 25 formed at the surface part of the silicon substrate 1 exposed from the bit contact opening portion 24a. As described above, the bit lines 30 of the embodiment also serve as contact plugs connected to the diffusion area 25 which becomes a part of the source and drain areas. In the manufacturing method of the embodiment, the bit lines 30 also serving as the contact plugs are formed (integrally formed) by one lithography process.

In the embodiment, since the HDP film is used as the first interlayer insulating film 22, wet resistance is high. Since the width of the bit contact opening portions 24a does not widen when forming the bit lines 30, it is possible to secure a sufficient processing margin.

In addition, since the HDP film is used as the first interlayer insulating film 22, the flatness of the upper face of the first interlayer insulating film 22 is high and there is no level difference. Accordingly, when the bit contact plugs and the bit lines 30 are integrally formed, there is no increase in the etching amount or no recession of a mask. As a result, it is possible to secure a sufficient processing margin.

In the embodiment, the bit contact plugs and the bit lines are formed by one lithography and dry etching. Accordingly, since misalignment of the bit contact plugs and the bit lines, such as a diameter of the bit contact plugs becoming larger than a bit line width, does not occur, it is possible to suppress the problem of a short circuit with the other conductor.

The bit lines 30 are formed as a pattern extending in an intersecting direction (the X direction shown in FIG. 1) of the word lines 23A and the embedded line 23B. The bit lines 30 shown in FIG. 1 are shown having a linear shape perpendicular to the word lines 23A, but it is not limited thereto. For example, the bit lines 30 may be formed in a partially curved shape.

Figure 17B:
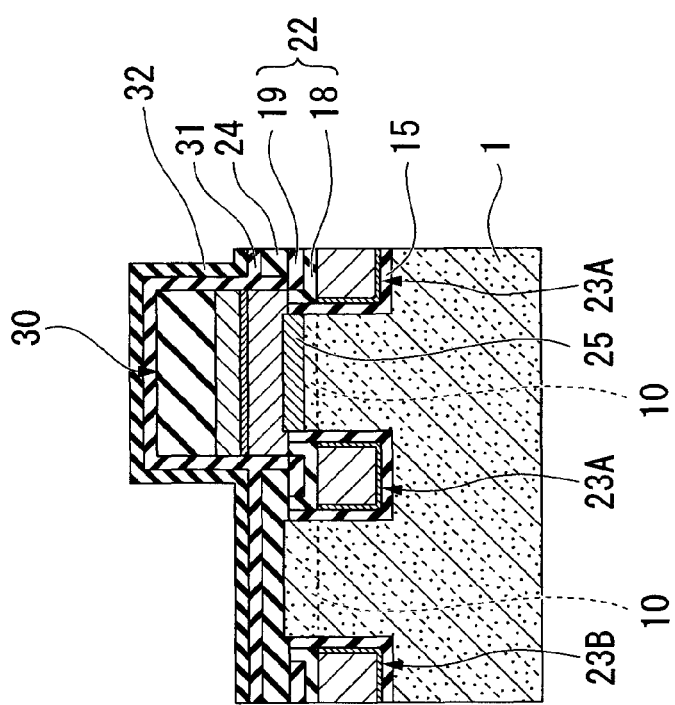
FIG. 17B is a fragmentary cross sectional elevation view, taken along a B-B line of FIG. 1, illustrating a memory cell in a step, subsequent to the step of FIGS. 16A and 16B, involved in the method of forming the semiconductor device of FIGS. 1, 2A and 2B.
Figure 17A:
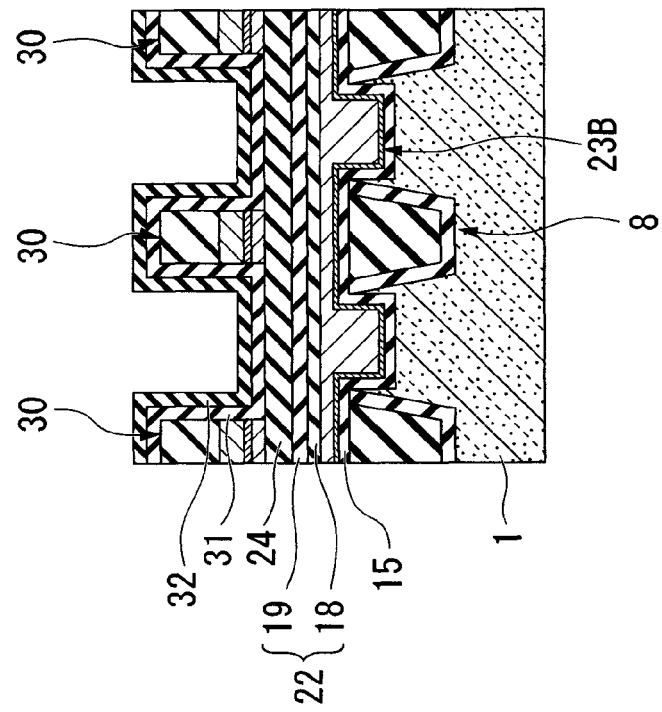
FIG. 17A is a fragmentary cross sectional elevation view, taken along an A-A line of FIG. 1, illustrating a memory cell in a step, subsequent to the step of FIGS. 16A and 16B, involved in the method of forming the semiconductor device of FIGS. 1, 2A and 2B.

Then, as shown in FIG. 17A and FIG. 17B, the silicon nitride film 31 is formed on the first interlayer insulating film 24 to cover the surface of the bit lines 30, and then a liner film 32 is laminated to cover the surface of the silicon nitride film 31. As the liner film 32, for example, a silicon nitride film ($Si_3N_4$), a silicon oxynitride film (SiON), or the like may be used.

As described above, the DRAM 60 of the embodiment is provided with the peripheral circuit area (not shown) in the peripheral area of the memory cell areas shown in FIG. 1. When, for example, a planar-type MOS transistor is formed in the peripheral circuit area, it is possible to simultaneously form a gate electrode of the planar type MOS transistor when the bit lines 30 formed of the laminated film are formed. The laminated film formed of the silicon nitride film 31 and the liner film 32 covering the side faces of the bit lines 30 may be used as a part of a side wall of the gate electrode in the planar type MOS transistor formed in the peripheral circuit area.

(Process of Forming Capacitance Contact Plugs)

Figure 18A:
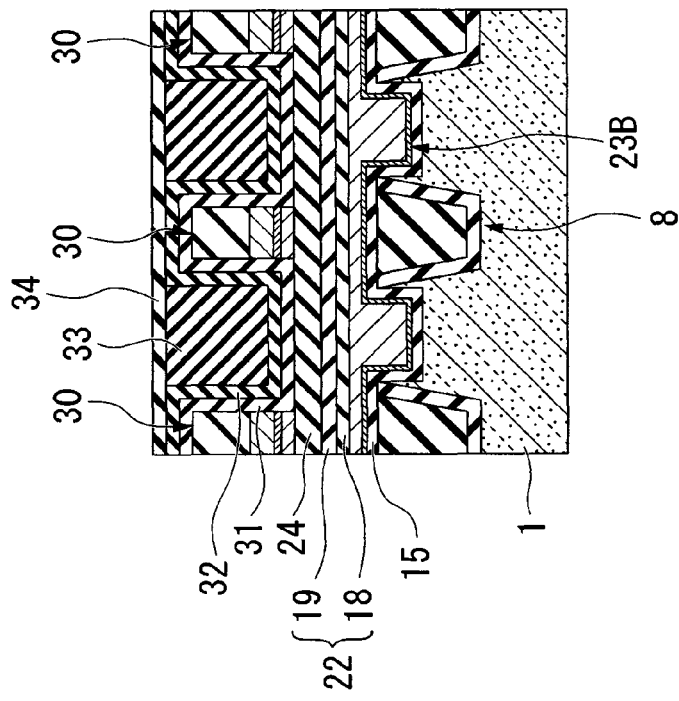
FIG. 18A is a fragmentary cross sectional elevation view, taken along an A-A line of FIG. 1, illustrating a memory cell in a step, subsequent to the step of FIGS. 17A and 17B, involved in the method of forming the semiconductor device of FIGS. 1, 2A and 2B.
Figure 18B:
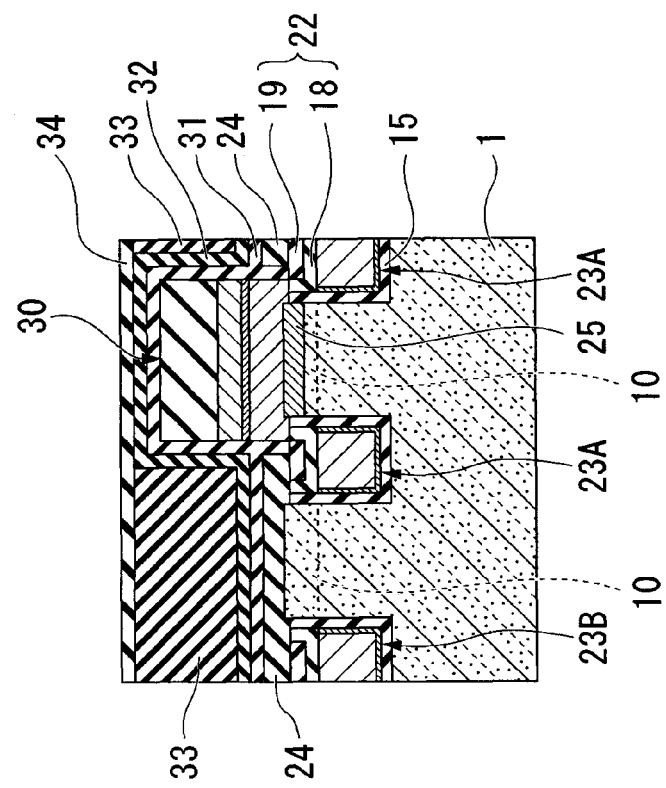
FIG. 18B is a fragmentary cross sectional elevation view, taken along a B-B line of FIG. 1, illustrating a memory cell in a step, subsequent to the step of FIGS. 17A and 17B, involved in the method of forming the semiconductor device of FIGS. 1, 2A and 2B.

Capacitance contact plugs 41 are formed. The capacitance contact plugs 41 are formed as follows. First, as shown in FIG. 18A and FIG. 18B, SOD is applied onto the liner film 32 to fill a space between the bit lines 30, then an annealing process is performed in an atmosphere with water vapor ($H_2O$) to reform the SOD into a solid film, and an SOD film (insulating film) 33 is formed. Then, CMP is performed until the upper face of the liner film 32 is exposed to planarize the surface of the substrate, and then a second interlayer insulating film 34 is formed to cover the SOD film 33 and the upper face of the liner film 32. As the second interlayer insulating film 34, for example, a silicon oxide film formed by the CVD method may be used.

Figure 19A:
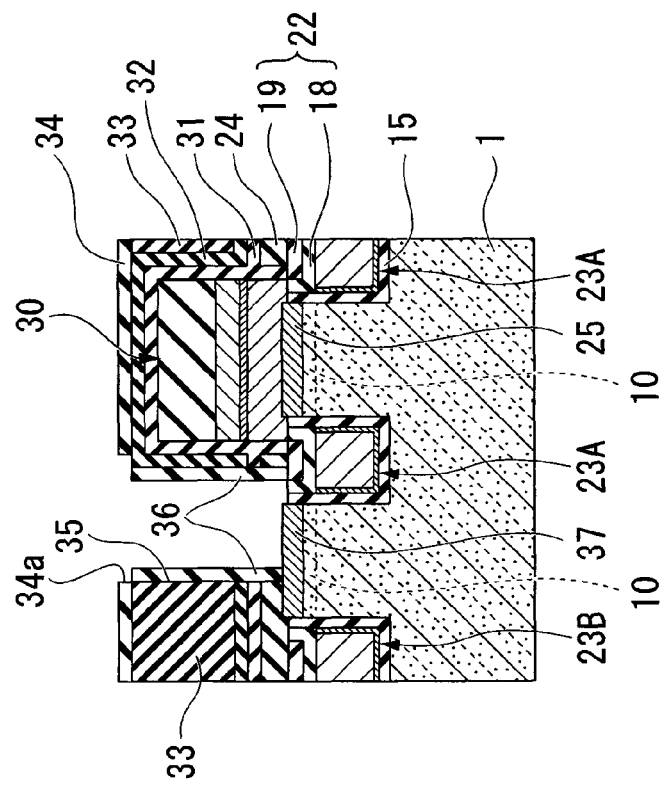
FIG. 19A is a fragmentary cross sectional elevation view, taken along an A-A line of FIG. 1, illustrating a memory cell in a step, subsequent to the step of FIGS. 18A and 18B, involved in the method of forming the semiconductor device of FIGS. 1, 2A and 2B.
Figure 19B:
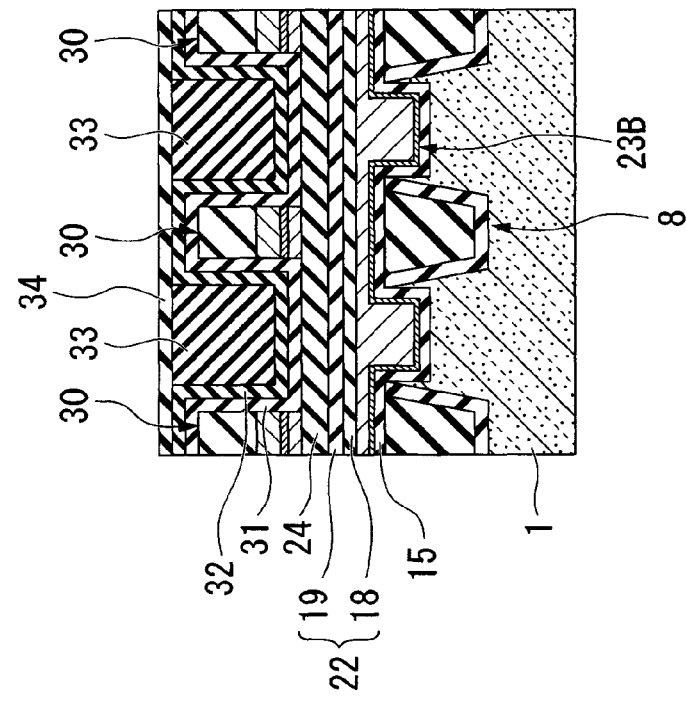
FIG. 19B is a fragmentary cross sectional elevation view, taken along a B-B line of FIG. 1, illustrating a memory cell in a step, subsequent to the step of FIGS. 18A and 18B, involved in the method of forming the semiconductor device of FIGS. 1, 2A and 2B.

As shown in FIG. 19A and FIG. 19B, a capacitance contact opening portion 35 is formed using a photolithography technique and a dry etching technique. The capacitance contact opening portion 35 is formed by an SAC (Self Alignment Contact) method using, as side walls, the silicon nitride film 31 and the liner film 32 formed as the side walls of the bit lines 30.

Figure 26:
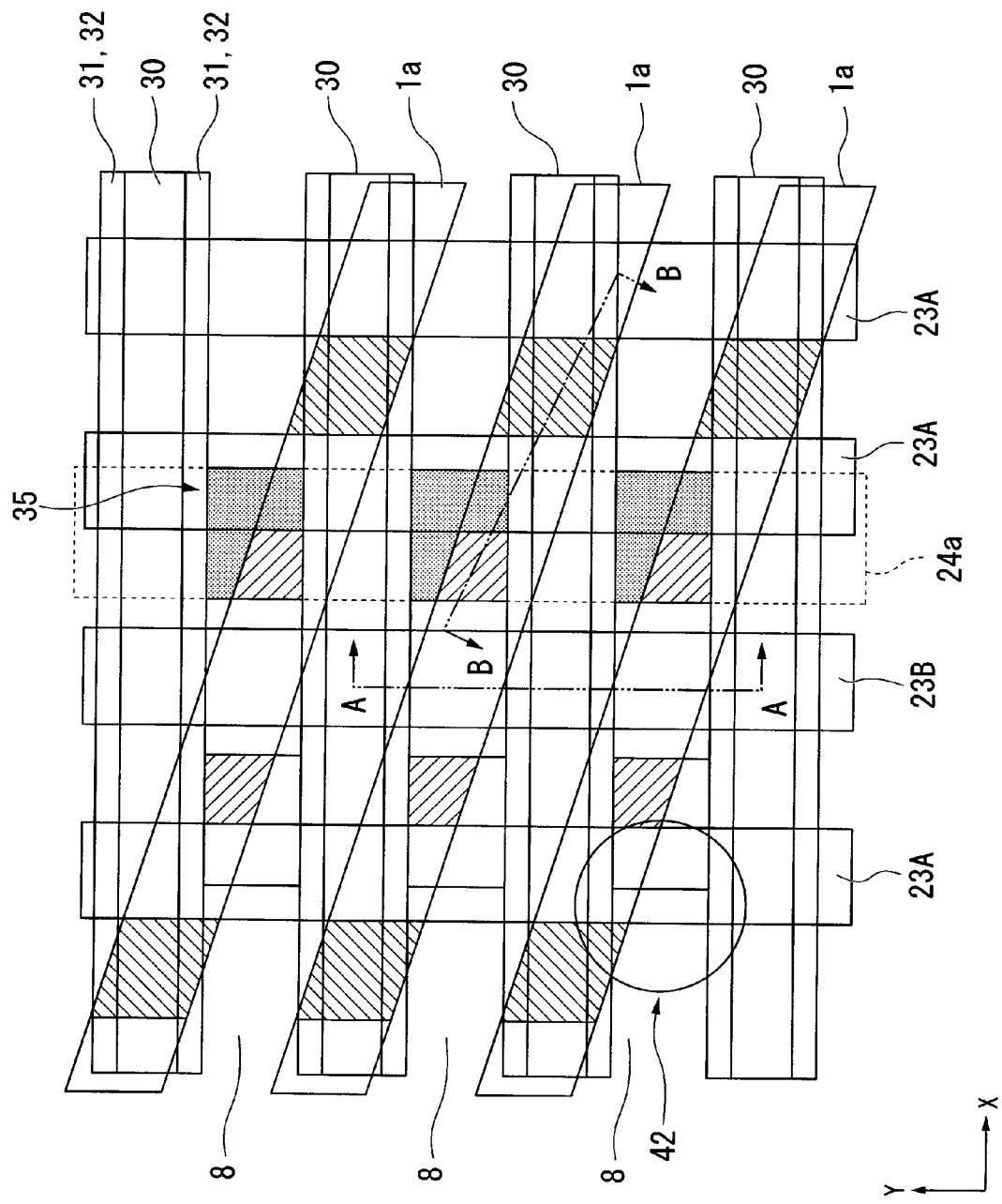
FIG. 26 is a fragmentary plan view illustrating a semiconductor device in accordance with a second preferred embodiment of the present invention.

Specifically, as shown in FIG. 26, first, a linear opening pattern 34a extending, for example, in the same direction (the Y direction shown in FIG. 26) as that of the word lines 23A is formed in the second interlayer insulating film 34. When forming the opening pattern 34a, when the SOD film 33 is dry-etched with the second interlayer insulating film 34, an opening, a width direction of which is regulated in the silicon nitride film 31 and the liner film 32 formed on the side face of the bit lines 30, is self-aligned in the SOD film 33. Then, the liner film 32 exposed from the opening, the silicon nitride film 31, and the first interlayer insulating film 24 are sequentially removed by etching so as to form the capacitance contact opening portion 35.

As shown in FIG. 26, at the part where the capacitance contact opening portion 35 overlaps with the active areas 1a, the silicon surface of the silicon substrate 1 is exposed from the capacitance contact opening portion 35 as shown in FIG. 19B.

Then, as shown in FIG. 19A and FIG. 19B, side walls (SW) 36 formed of, for example, silicon nitride film are formed on the inner wall portions of the capacitance contact opening portion 35. Then, N type impurities such as phosphorous are injected by ion injection to the surface of the silicon substrate 1 exposed from the capacitance contact opening portion 35, using the second interlayer insulating film 34 as a mask. Accordingly, an N type impurity diffusion layer is formed in the vicinity of the silicon surface of the silicon substrate 1. The N type impurity diffusion layer becomes a diffusion area 37 serving as the other part (source area in the embodiment) of the source and drain areas of the transistor.

Figure 20A:
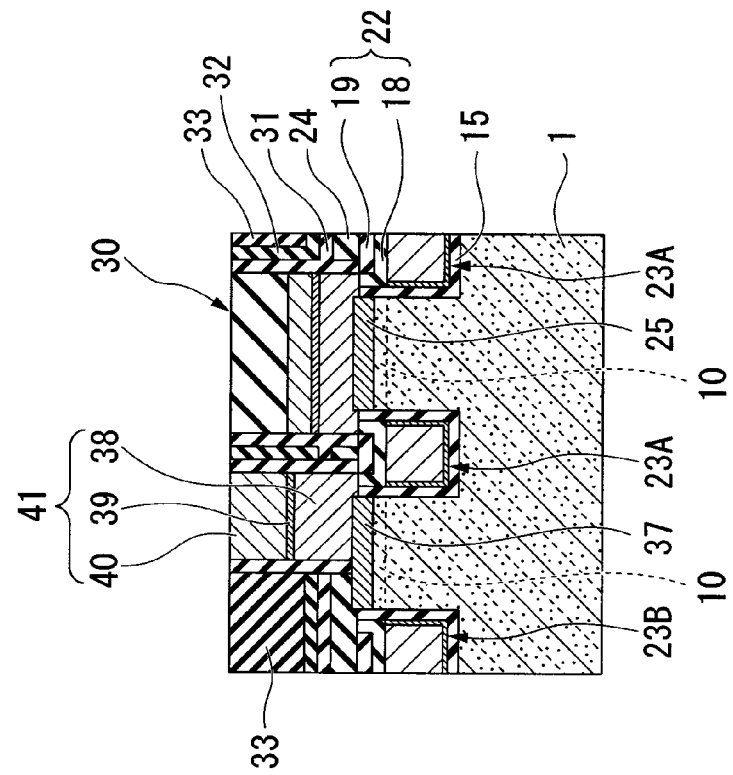
FIG. 20A is a fragmentary cross sectional elevation view, taken along an A-A line of FIG. 1, illustrating a memory cell in a step, subsequent to the step of FIGS. 19A and 19B, involved in the method of forming the semiconductor device of FIGS. 1, 2A and 2B.
Figure 20B:
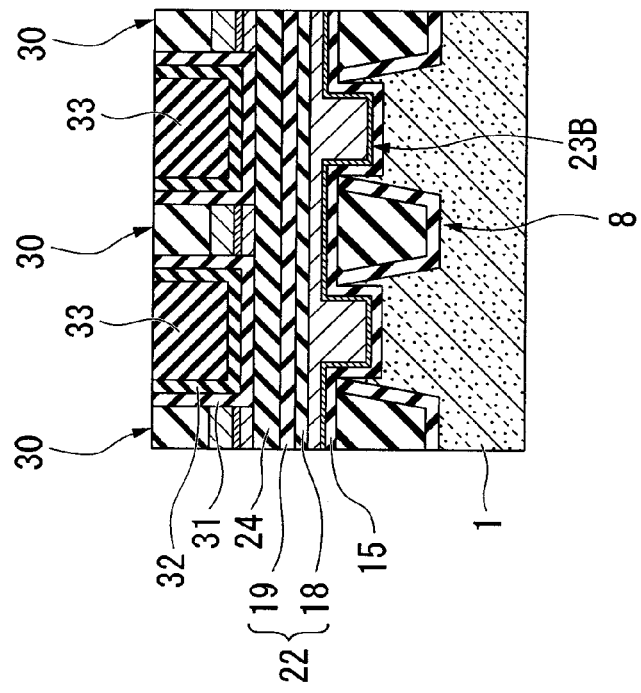
FIG. 20B is a fragmentary cross sectional elevation view, taken along a B-B line of FIG. 1, illustrating a memory cell in a step, subsequent to the step of FIGS. 19A and 19B, involved in the method of forming the semiconductor device of FIGS. 1, 2A and 2B.

Then, as shown in FIG. 20A and FIG. 20B, polysilicon containing phosphorous is laminated on the second interlayer insulating film 34 to fill the inside of the capacitance contact opening portion 35, and then etch-back is performed to form a polysilicon layer 38 at the bottom of the capacitance contact opening portion 35. Then, after a cobalt silicide (CoSi) layer 39 is formed on the surface of the polysilicon layer 38, then tungsten is laminated to fill the inside of the capacitance contact opening portion 35, and a tungsten film is formed. Then, the surface is planarized by CMP until the surface of the SOD film 33 is exposed, and tungsten remains in the capacitance contact opening portion 35 to form a tungsten layer 40. In such a manner, the capacitance contact plugs 41 formed of the polysilicon layer 38, the cobalt silicide layer 39, and the tungsten layer 40 are formed.

(Process of Forming Capacitor)

Figure 21B:
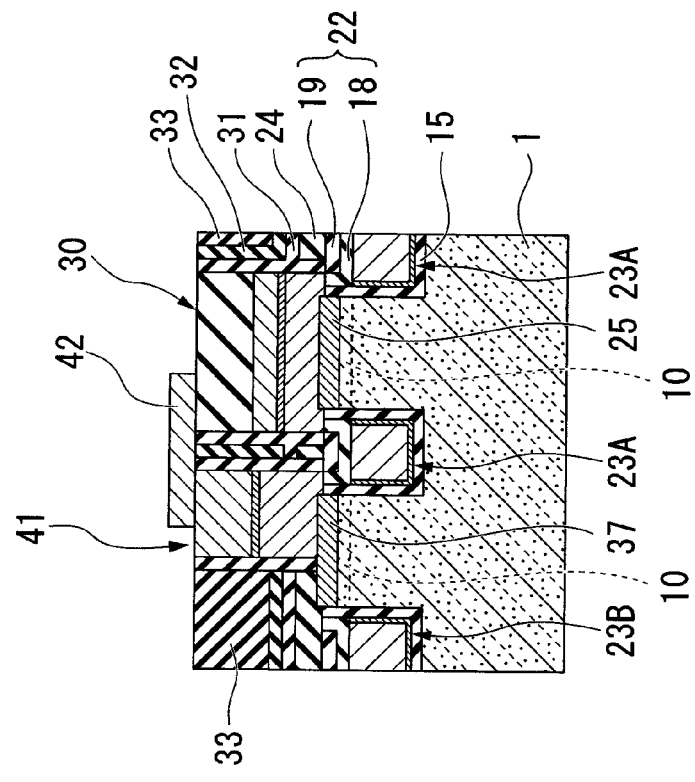
FIG. 21B is a fragmentary cross sectional elevation view, taken along a B-B line of FIG. 1, illustrating a memory cell in a step, subsequent to the step of FIGS. 20A and 20B, involved in the method of forming the semiconductor device of FIGS. 1, 2A and 2B.
Figure 21A:
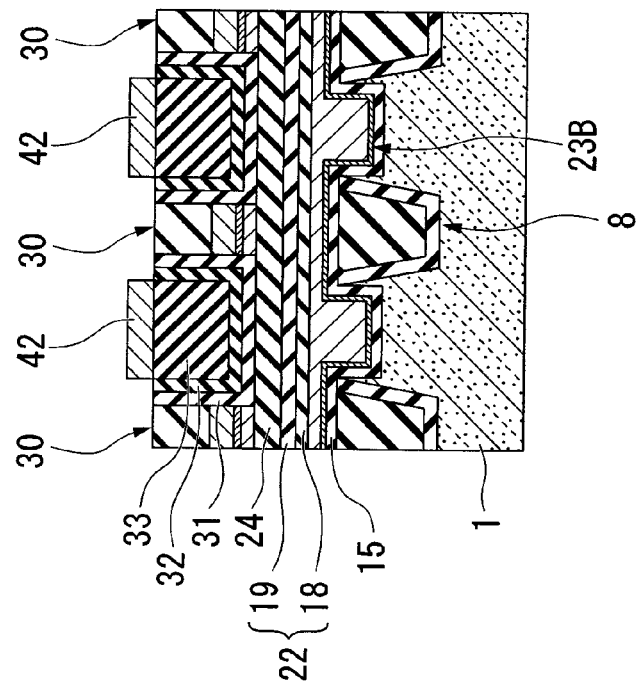
FIG. 21A is a fragmentary cross sectional elevation view, taken along an A-A line of FIG. 1, illustrating a memory cell in a step, subsequent to the step of FIGS. 20A and 20B, involved in the method of forming the semiconductor device of FIGS. 1, 2A and 2B.

Then, capacitors are formed. The capacitors are formed as follows. First, tungsten nitride (WN) and tungsten (W) are sequentially laminated on the surface of the substrate after the capacitance contact plugs 41 are formed so as to form a laminated film. Then, the laminated film is patterned to form capacitance contact pads 42 as shown in FIG. 21A and FIG. 21B. As shown in FIG. 1, it is necessary to form the capacitance contact pads 42 in the memory cell areas at equal intervals. For this reason, as shown in FIG. 21B, although the capacitance contact pad 42 is formed at a position deviating from the upside of the capacitance contact plug 41, the capacitance contact plug 41 is connected to the capacitance contact pad 42 at a part where the bottom face of the capacitance contact pad 42 is overlapped with the upper face of the capacitance contact plug 41.

Figure 22A:
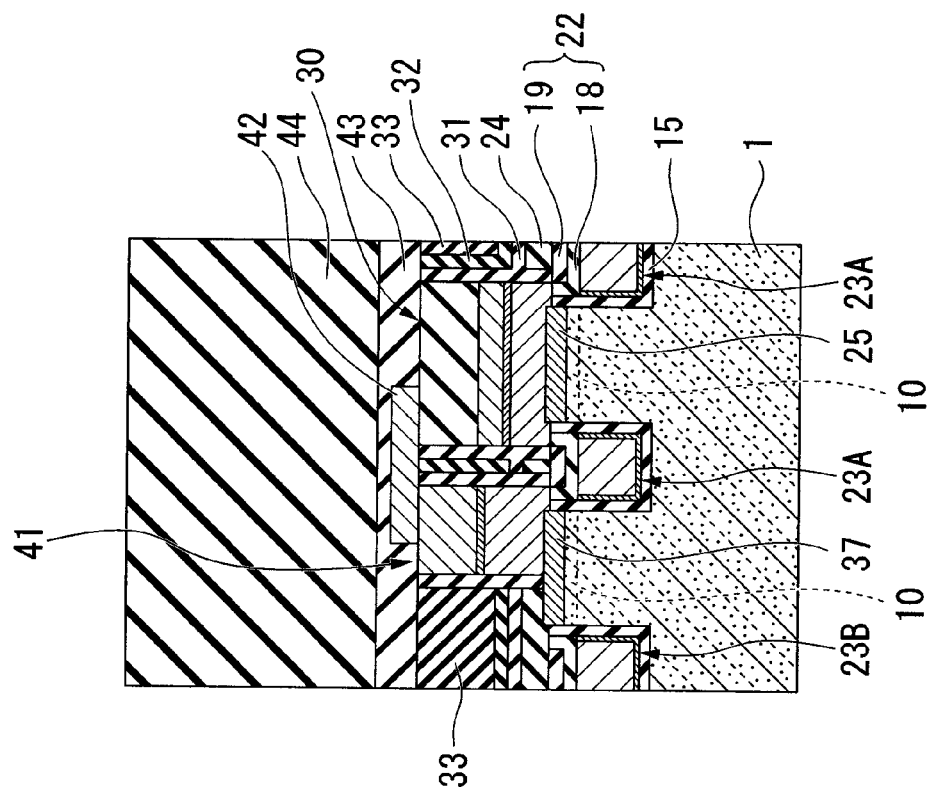
FIG. 22A is a fragmentary cross sectional elevation view, taken along an A-A line of FIG. 1, illustrating a memory cell in a step, subsequent to the step of FIGS. 21A and 21B, involved in the method of forming the semiconductor device of FIGS. 1, 2A and 2B.
Figure 22B:
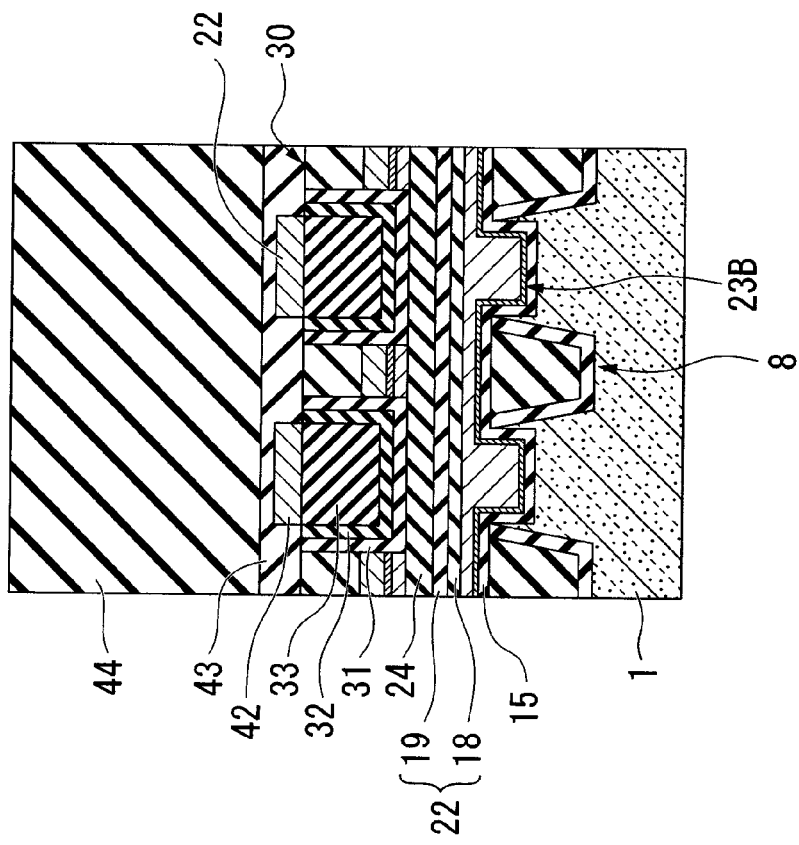
FIG. 22B is a fragmentary cross sectional elevation view, taken along a B-B line of FIG. 1, illustrating a memory cell in a step, subsequent to the step of FIGS. 21A and 21B, involved in the method of forming the semiconductor device of FIGS. 1, 2A and 2B.

As shown in FIG. 22A and FIG. 22B, a stopper film 43 is formed on the substrate using, for example, a silicon nitride film or the like, to cover the capacitance contact pads 42. A third interlayer insulating film 44 is formed on the stopper film 43, using, for example, a silicon oxide film or the like.

Figure 23A:
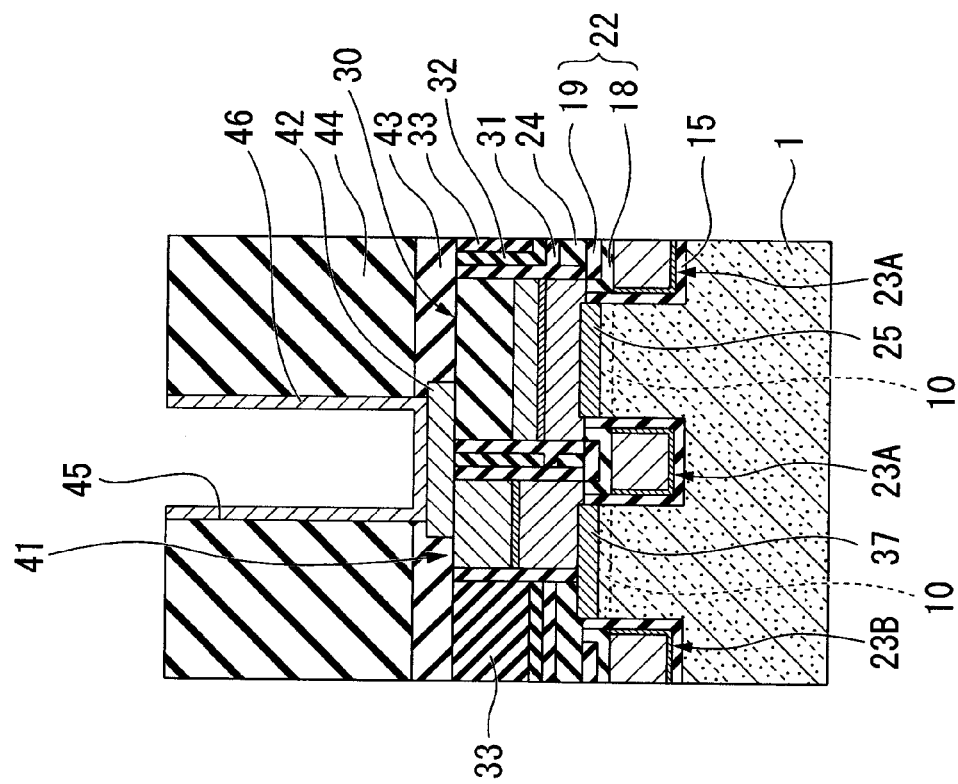
FIG. 23A is a fragmentary cross sectional elevation view, taken along an A-A line of FIG. 1, illustrating a memory cell in a step, subsequent to the step of FIGS. 22A and 22B, involved in the method of forming the semiconductor device of FIGS. 1, 2A and 2B.
Figure 23B:
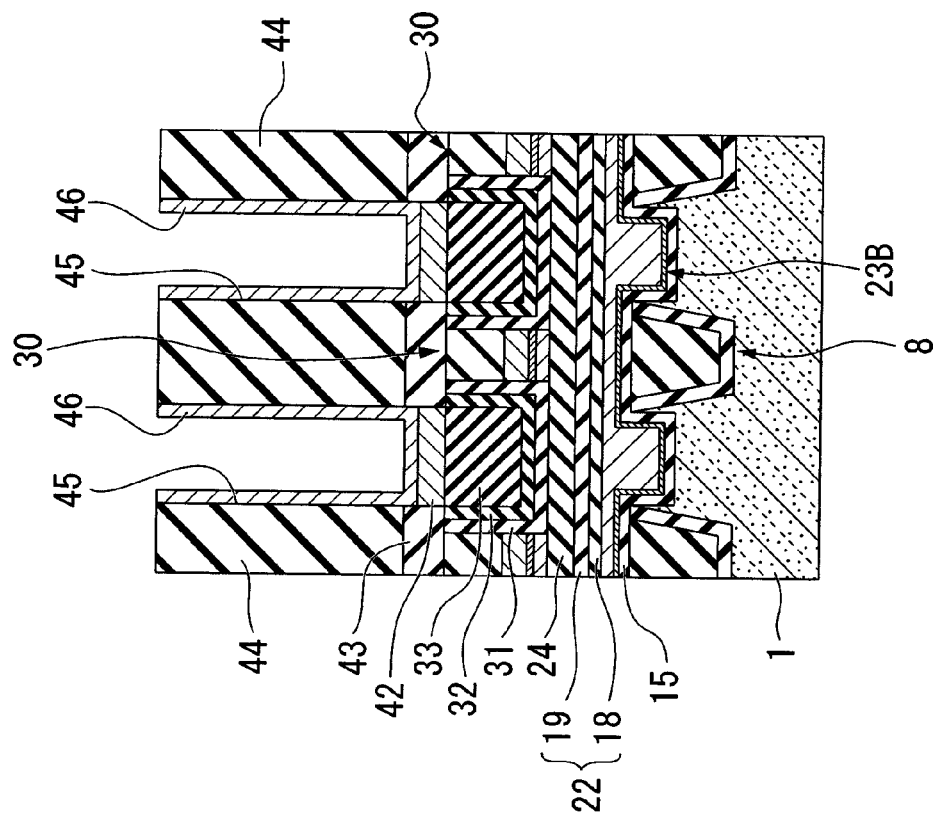
FIG. 23B is a fragmentary cross sectional elevation view, taken along a B-B line of FIG. 1, illustrating a memory cell in a step, subsequent to the step of FIGS. 22A and 22B, involved in the method of forming the semiconductor device of FIGS. 1, 2A and 2B.

As shown in FIG. 23A and FIG. 23B, contact holes 45 passing through the third interlayer insulating film 44 and the stopper film 43 formed on the capacitance contact pads 42 are formed to expose a part of the upper faces of the capacitance contact pads 42. Then, lower electrodes 46 of the capacitor elements are formed using, for example, titanium nitride or the like, to cover the inner wall faces of the contact holes 45 and the upper faces of the exposed capacitance contact pads 42. Accordingly, the bottoms of the lower electrodes 46 are connected to the upper faces of the capacitance contact pads 42.

Figure 24A:
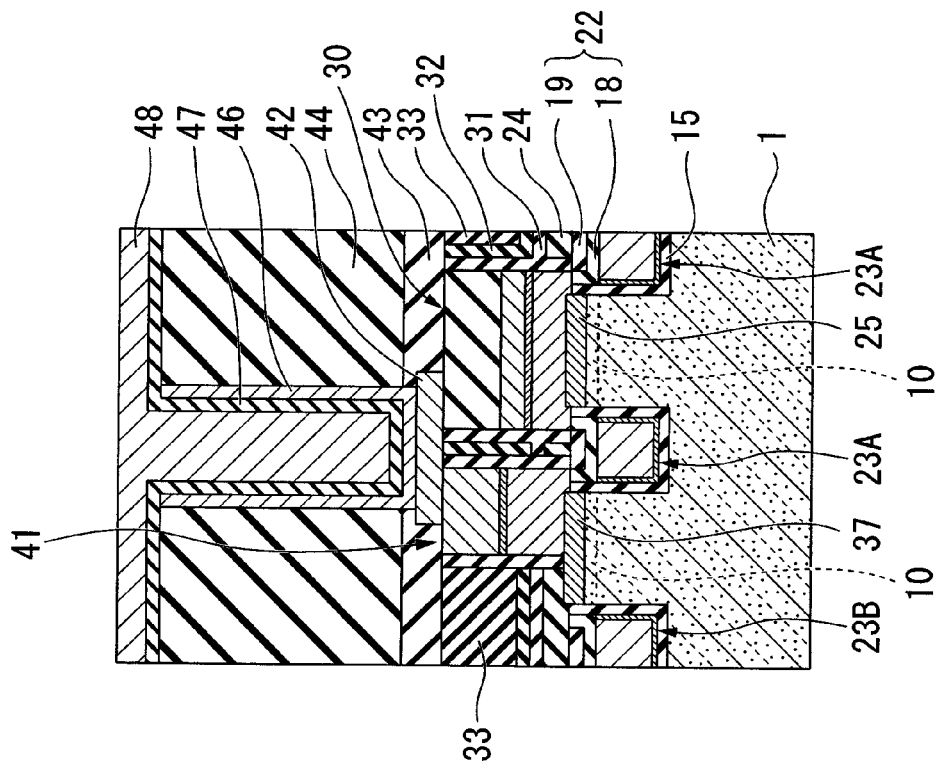
FIG. 24A is a fragmentary cross sectional elevation view, taken along an A-A line of FIG. 1, illustrating a memory cell in a step, subsequent to the step of FIGS. 23A and 23B, involved in the method of forming the semiconductor device of FIGS. 1, 2A and 2B.
Figure 24B:
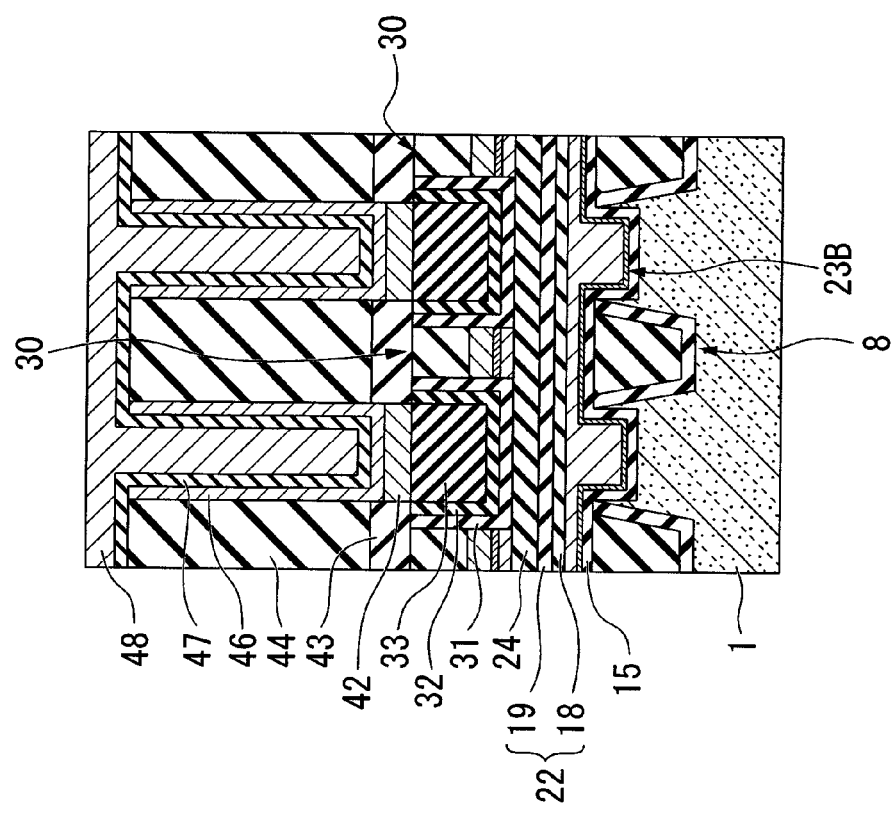
FIG. 24B is a fragmentary cross sectional elevation view, taken along a B-B line of FIG. 1, illustrating a memory cell in a step, subsequent to the step of FIGS. 23A and 23B, involved in the method of forming the semiconductor device of FIGS. 1, 2A and 2B.

As shown in FIG. 24A and FIG. 24B, a capacitance insulating film 47 is formed on the third interlayer insulating film 44 to cover the surfaces of the lower electrodes 46. As the capacitance insulating film 47, for example, zirconium oxide ($ZrO_2$), aluminum oxide ($Al_2O_3$), hafnium oxide ($HfO_2$), and a laminated film thereof may be used. Then, an upper electrode 48 of the capacitor elements is formed using, for example, titanium nitride or the like, to cover the surface of the capacitance insulating film 47. In such a manner, the capacitors are formed.

(Process of Forming Line Layer)

Then, a line layer is formed on the silicon substrate 1 with the capacitor elements interposed therebetween. The line layer is formed as follows. First, as shown in FIG. 25A and FIG. 25B, a fourth interlayer insulating film 49 formed of, for example, a silicon oxide film or the like, is formed on the upper electrode 48 to cover the upper electrode 48. Then, upper metal lines 50 are formed of, for example, aluminum (Al), copper (Cu), or the like on the fourth interlayer insulating film 49. Thereafter, a protective film 51 is formed to cover the upper metal lines 50, and thus the DRAM memory cells are completed.

As described above, the DRAM 60 of the embodiment is manufactured.

According to the method of manufacturing the DRAM (semiconductor device) 60 of the embodiment as described above, in the embedded gate transistors in which the word lines are embedded in the silicon substrate 1, the first interlayer insulating film 22 is formed to cover the level difference formed between the upper face of the silicon substrate 1 and the upper face of the cap insulating film 22 when the first interlayer insulating film 22 is formed on the upper face of the silicon substrate 1 in which the embedded gate electrodes 22A and the cap insulating film 22 are formed, and the upper face of the first interlayer insulating film 22 is planarized. By forming the bit contact plugs and the bit lines 30 using such a first interlayer insulating film 22, it is possible to suppress the increase of the etching amount and the recession of the mask. Accordingly, it is possible to provide the method of manufacturing the semiconductor device which has a large processing margin for pattern formation and is suitable for miniaturization.

According to the method of manufacturing the DRAM 60 of the embodiment, the wet resistance of the HDP film used as the first interlayer insulating film 22 is high, and the width of the bit contact opening portions 24a does not widen when forming the bit lines 30. Accordingly, it is possible to secure a sufficient processing margin.

In addition, by the HDP film used as the first interlayer insulating film 22, the flatness of the upper face of the first interlayer insulating film 22 is high and there is no level difference, and there is no increase of the etching amount and no recession of the mask when the bit contact plugs and the bit lines 30 are integrally formed. Accordingly, it is possible to secure a sufficient processing margin.

Furthermore, according to the method of manufacturing the DRAM 60 of the embodiment, the bit contact plugs and the bit lines 30 are formed by one lithography and dry etching, misalignment of the bit contact plugs and the bit lines, such as the diameter of the bit contact plug being larger than the bit line width, does not occur. For this reason, it is possible to suppress the problem of a short circuit with the other conductor.

The technical field of the invention is not limited to the embodiment, and may be variously modified within a scope which does not deviate from the concept of the invention. For example, in the DRAM of the embodiment, in the configuration of the memory cells, an example of using the recess channel type transistors as the embedded type transistors in which the word lines are completely embedded in the semiconductor substrate was shown, but the invention is not limited thereto, and various types of embedded transistors may be applied.

Figure 27B:
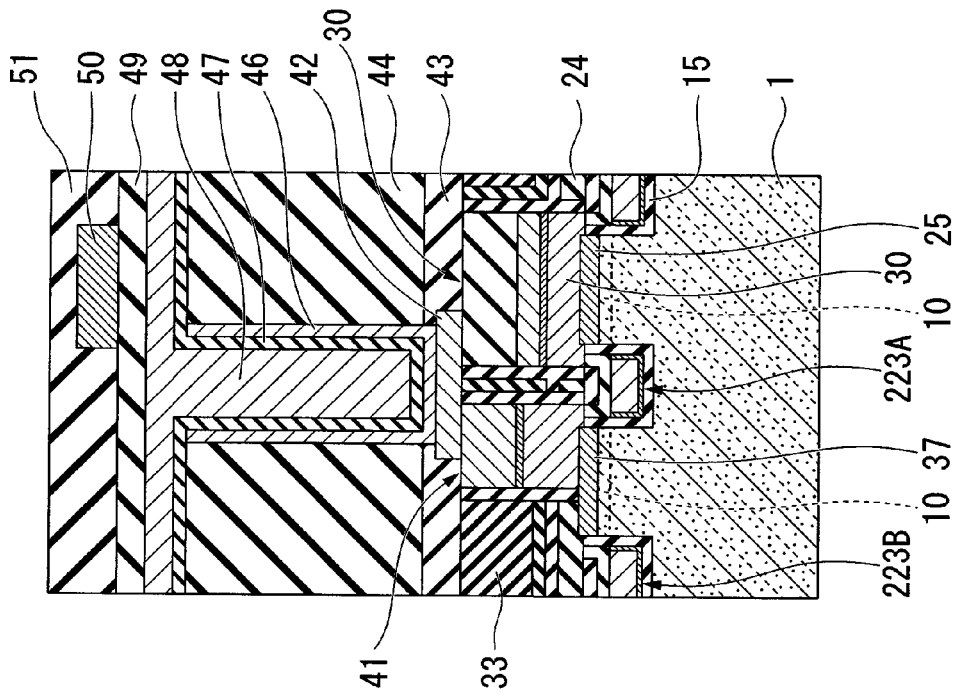
FIG. 27B is a fragmentary cross sectional elevation view, taken along a B-B line of FIG. 26, illustrating a memory cell in the semiconductor device of FIG. 1.
Figure 27A:
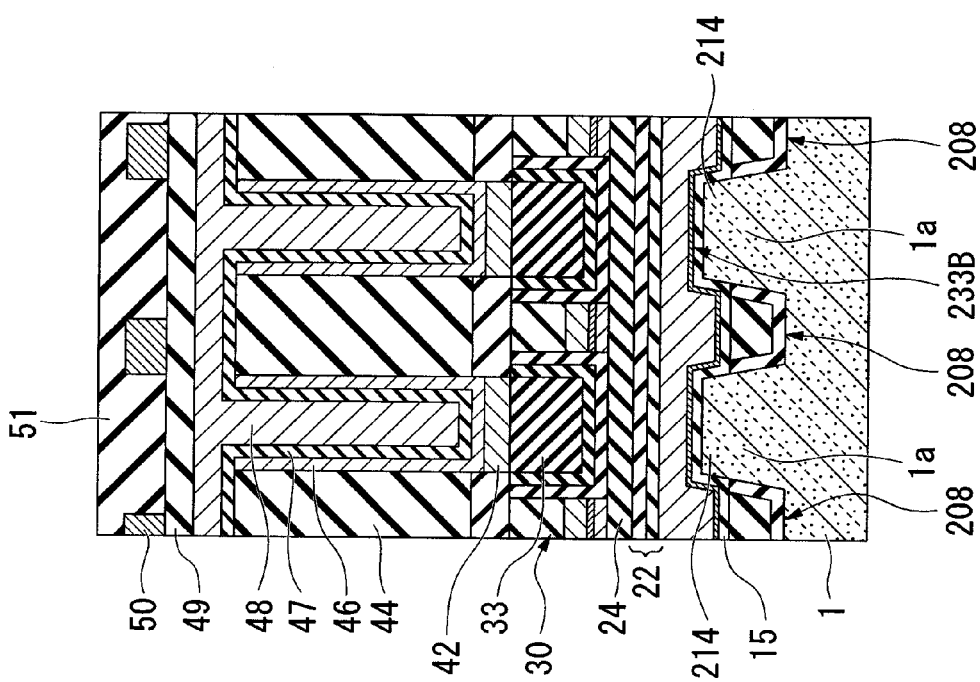
FIG. 27A is a fragmentary cross sectional elevation view, taken along an A-A line of FIG. 26, illustrating a memory cell in the semiconductor device of FIG. 1.

Specifically, a configuration of memory cells may be exemplified as shown in FIG. 27A and FIG. 27B. In the same manner, the memory cells of the example are a laminated structure of forming embedded gate transistors formed of a semiconductor substrate in which the word lines are completely embedded therein, capacitors, and a line layer, and configurations other than the configuration of the embedded gate transistor are the same as the embodiment. Accordingly, in the following description, the same reference numerals and signs are given to the same constituent elements as the semiconductor device of the embodiment, and the description thereof is not repeated.

As shown in FIG. 27A and FIG. 27B, in the embedded gate transistors of this example, a part of the bottom face of the embedded line 223B is embedded in the upper face of the STI element isolation film 208 provided in the lengthwise direction of the embedded line 223B as shown in FIG. 27A. That is, the upper face of the STI element isolation film 208 is lower than the surface of the silicon substrate 1 between the adjacent STI element isolation films 208. Accordingly, adjacent saddle-shaped silicon portions 214, with the part embedded in the STI element isolation film 208 and the gate insulating film 15 interposed therebetween, of the bottom face of the embedded line 223B are provided on the upper face of the silicon substrate 1.

Herein, the embedded gate electrodes 223A have the same structure as the embedded line 223B, and thus the same saddle-shaped silicon portions 214 are provided even in the embedded gate electrodes 223A. The saddle-shaped silicon portions 214 can serve as channels when a potential difference between the source area and the drain area exceeds a threshold value. As described above, the embedded gate transistors of the example constitute saddle fin type transistors having the same channel areas as the saddle-shaped silicon portions 214.

Subsequently, a method of manufacturing the saddle fin type transistors having the above-described configuration will be described.

The formation of a hard mask (see FIG. 7) in the process of forming the element isolation areas (see FIG. 3A to FIG. 6B) and the process of forming the embedded gate electrodes is the same as the embodiment.

Figure 28B:
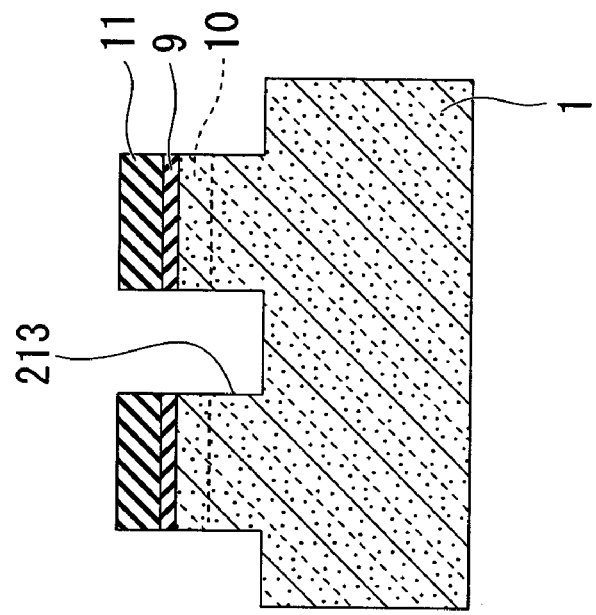
FIG. 28B is a fragmentary cross sectional elevation view, taken along a B-B line of FIG. 26, illustrating a memory cell in a step involved in a method of forming the semiconductor device of FIGS. 26, 27A and 27B.
Figure 28A:
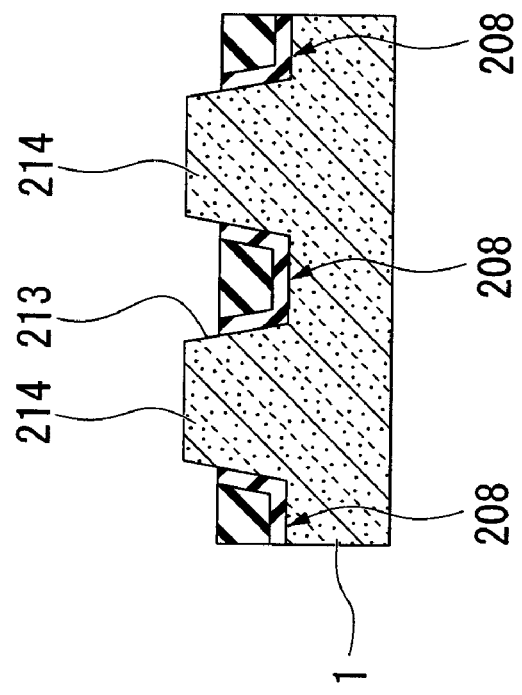
FIG. 28A is a fragmentary cross sectional elevation view, taken along an A-A line of FIG. 26, illustrating a memory cell in a step involved in a method of forming the semiconductor device of FIGS. 26, 27A and 27B.

Then, as shown in FIG. 28A and FIG. 28B, the silicon substrate 1 exposed from the hard mask is etched by dry etching, thereby forming the gate electrode grooves (trenches) 213. As shown in FIG. 28A, when the gate electrode grooves 213 are formed, a part of the STI element isolation film 208 is etched deeper than a part of the silicon layer of the silicon substrate 1. Accordingly, the saddle-shaped silicon portions 214 remain at the parts coming into contact with the gate electrode grooves 213 at a part of the silicon layer higher than the upper face of the STI element isolation film 208. The saddle-shaped silicon portions 214 serve as the channel areas of the transistors.

As shown in FIG. 9A and FIG. 9B, the gate insulating film 15 is formed on the inner wall faces of the gate electrode grooves 213 and the entire surface of the substrate, and then gate electrode materials are sequentially laminated on the gate insulating film 15 to fill the insides of the gate electrode grooves 213.

Figure 29A:
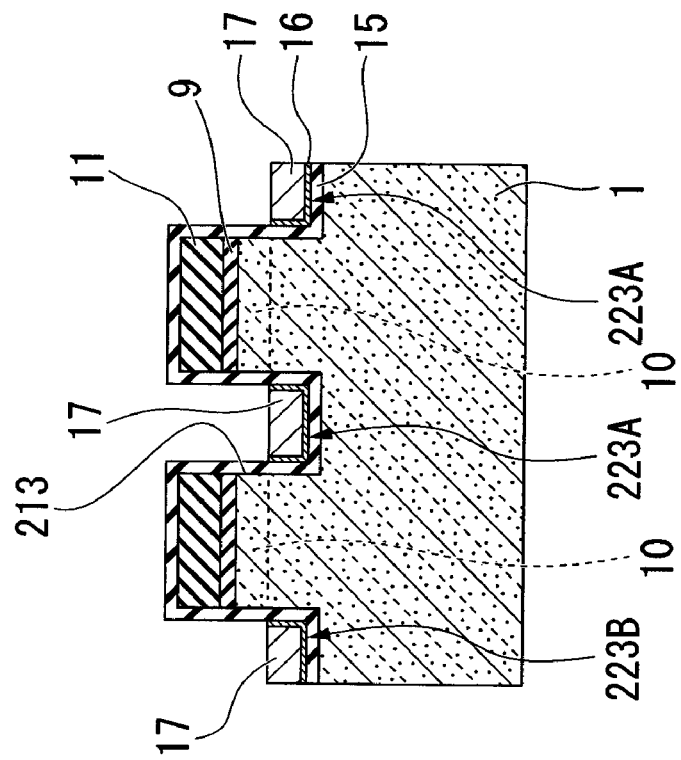
FIG. 29A is a fragmentary cross sectional elevation view, taken along an A-A line of FIG. 26, illustrating a memory cell in a step, subsequent to the step of FIGS. 28A and 28B, involved in the method of forming the semiconductor device of FIGS. 26, 27A and 27B.
Figure 29B:
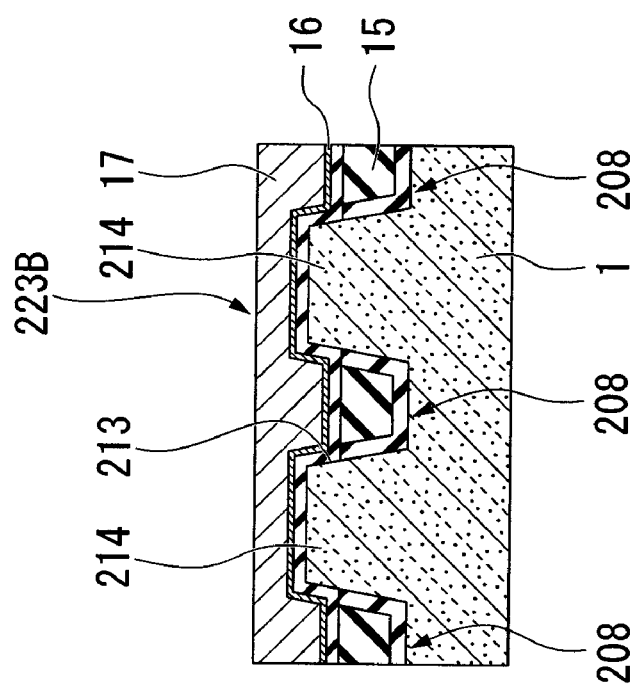
FIG. 29B is a fragmentary cross sectional elevation view, taken along a B-B line of FIG. 26, illustrating a memory cell in a step, subsequent to the step of FIGS. 28A and 28B, involved in the method of forming the semiconductor device of FIGS. 26, 27A and 27B.

As shown in FIG. 29A and FIG. 29B, the titanium nitride film 16 and the tungsten film 17 embedded in the gate electrode grooves 213 are etched back such that the titanium nitride film 16 and the tungsten film 17 remain only at the bottoms of the gate electrodes grooves 213. In such a manner, the embedded gate electrodes (word lines) 223A and the embedded line 223B embedded in the gate electrodes grooves 213 provided in the silicon substrate 1 are formed.

The later processes are the same as the above-described embodiment.

As described in the example, there is an advantage of increasing an on-current by applying the saddle fin type transistors as the embedded gate transistors.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
    forming active regions and isolation regions in a semiconductor substrate, the active regions and isolation regions extending in line patterns in a first direction, the active regions and isolation regions being alternately aligned in a second direction across the first direction;
    forming gate electrode grooves in the semiconductor substrate, the gate electrode grooves extending in the second direction and across the active regions and isolation regions;
    forming gate insulating films on inside walls of the gate electrode grooves;
    forming buried gate electrodes on the gate insulating films and in lower portions of the gate electrode grooves;
    forming cap insulating films in upper portions of the gate electrode grooves, the cap insulating films covering the buried gate electrodes;
    forming a first interlayer insulating film on an upper surface of the cap insulating film and on an upper surface of the semiconductor substrate;
    planarizing an upper surface of the first interlayer insulating film;
    forming openings in line shape in the first interlayer insulating film, the openings exposing first active regions and the isolation regions, the first active regions being adjacent to the isolation regions in the second direction, the first active regions being for formation of bit line contacts;
    forming a conductive layer which bury the openings and extends over the first interlayer insulating film, the conductive layer in the openings being in contact with upper surfaces of the first active regions;
    forming a first silicon nitride film on an upper surface of the conductive layer; and
    patterning a stack of the conductive layer and the first silicon nitride film to form bit-lines including bit contacts which are in contact with the upper surfaces of the first active regions.

2. The method according to claim 1, wherein forming the first inter-layer insulating film comprises carrying out a high density plasma deposition process.

3. The method according to claim 2, wherein forming the first inter-layer insulating film comprises forming a plasma oxide film.

4. The method according to claim 3, wherein planarizing the upper surface of the first interlayer insulating film comprises: carrying out a chemical mechanical polishing process that polishes the flat top surface of the first inter-layer insulating film.

5. The method according to claim 1, wherein forming the isolation regions comprises:
   forming isolation grooves in the semiconductor substrate; and
   forming isolation insulating films which buries the isolation grooves.

6. The method according to claim 5, wherein forming the isolation insulating film comprises:
   forming a first silicon oxide film on inside walls of the isolation groove;
   forming a silicon nitride film on a bottom portion of the first silicon oxide film, the bottom portion being over a bottom of the isolation groove; and
   forming a second silicon oxide film in the isolation groove to have the second silicon oxide film to bury the isolation groove.

7. The method according to claim 5, wherein the isolation regions extend without crossing the active regions.

8. The method according to claim 1, wherein a center one of three buried gate electrodes adjacent to each other in the active regions is to perform as a buried gate electrode for device isolation.

9. The method according to claim 1, wherein further comprising:
   after forming the bit lines, forming a second silicon nitride film which covers the semiconductor substrate including the first silicon nitride film and the bit lines;
   forming a second liner insulating film of silicon oxynitride on the second silicon nitride film;
   coating a coating insulating film on the second liner film to fill gaps between the bit lines extending in the third direction;
   carrying out an anneal in a vapor atmosphere to modify the coating insulating film;
   planarizing the coating insulating film to expose a surface of the second liner film; and
   forming a second inter-layer insulating film over the second liner film and the second liner film.

10. The method according to claim 9, further comprising:
   after forming the second inter-layer insulating film, forming a line-and-space pattern in the second inter-layer insulating film, the line-opening pattern having lines and spaces extending in the second direction, the line-opening pattern overlapping in plan view a part of a second active region and a part of the buried gate electrode, the second active region being positioned in the opposing side to the first active region with respect to the buried gate electrode;
   forming a capacitive contact hole, which reaches a part of the second active region, by sequentially etching, by using the line-and-space pattern, the coating insulating film, the second liner film under the coating insulating film, and the second silicon nitride film under the second liner film; and
   forming side wall insulating films on side walls of the capacitive contact films.

11. A method of forming a semiconductor device, the method comprising:
   forming active regions and isolation regions in a semiconductor substrate, the active regions and isolation regions extending in line patterns in a first direction, the active regions and isolation regions being alternately aligned in a second direction across the first direction;
   forming gate electrode grooves in the semiconductor substrate, the gate electrode grooves extending in the second direction and across the active regions and isolation regions;
   forming gate insulating films on inside walls of the gate electrode grooves;
   forming buried gate electrodes on the gate insulating films and in lower portions of the gate electrode grooves;
   forming cap insulating films in upper portions of the gate electrode grooves, the cap insulating films covering the buried gate electrodes;
   forming a first interlayer insulating film on an upper surface of the cap insulating film and on an upper surface of the semiconductor substrate;
   planarizing an upper surface of the first interlayer insulating film; and
   forming openings in line shape in the first interlayer insulating film, the openings exposing first active regions and the isolation regions, the first active regions being adjacent to the isolation regions in the second direction, the first active regions being for formation of bit line contacts,
   wherein forming the buried gate electrodes comprises:
   forming a silicon oxide film over the semiconductor substrate having the isolation regions;
   forming a silicon nitride film on the silicon oxide film;
   forming a carbon film on the silicon nitride film;
   patterning a stack of the silicon oxide film, the silicon nitride film, and the carbon film, to form hard masks, the hard masks extending in the second direction, the hard masks extending over the isolation region and the active region;
   selectively etching the isolation region and the active region by using the hard masks to form gate electrode grooves, the gate electrode grooves being in line-shape, the gate electrode grooves extending in the second direction;
   forming a gate insulating film which covers at least inside walls of the gate electrode grooves;
   forming a gate electrode material on the gate insulating film, the gate electrode material filling the gate electrode grooves; and
   etching back the gate electrode material to form buried gate electrodes in lower portions of the gate electrode grooves.

12. The method according to claim 11, wherein forming the gate electrode material comprises:
   forming a titanium nitride film; and
   forming a tungsten film on the titanium nitride film.

13. The method according to claim 11, wherein etching back the gate electrode material is carried out to form a saddle-fin structure such that the isolation region is deeper in etching depth than the active region, so that an etched surface of the active region is higher than an etched surface of the isolation region.

14. The method according to claim 11, wherein forming the cap insulating films in the upper portions of the gate electrode grooves comprises:
   forming a first liner insulating film which covers an upper surface of the buried gate electrode and an exposed surface of the gate insulating film, the exposed surface being in an inner wall of the gate electrode groove;
   forming a burying insulating film on the first liner insulating film, the burying insulating film burying the gate electrode grooves;
   carrying out a chemical mechanical polishing process to polish the burying insulating film;
   etching back residuals of the buried insulating film, the first liner film and the gate insulating film, the residuals being above the upper surface of the active region, so as to expose the upper surface of the active region.

* * * * *